(12) United States Patent
Masuda et al.

(10) Patent No.: US 12,111,537 B2
(45) Date of Patent: Oct. 8, 2024

(54) LIGHTING DEVICE, DISPLAY DEVICE, AND METHOD OF MANUFACTURING LIGHTING DEVICE

(71) Applicant: Sharp Display Technology Corporation, Kameyama (JP)

(72) Inventors: Takeshi Masuda, Kameyama (JP); Hisashi Watanabe, Kameyama (JP); Hirotoshi Yasunaga, Kameyama (JP)

(73) Assignee: Sharp Display Technology Corporation, Kameyama (JP)

( * ) Notice: Subject to any disclaimer, the term of this patent is extended or adjusted under 35 U.S.C. 154(b) by 0 days.

(21) Appl. No.: 18/418,899

(22) Filed: Jan. 22, 2024

(65) Prior Publication Data
US 2024/0280856 A1     Aug. 22, 2024

(30) Foreign Application Priority Data
Feb. 21, 2023  (JP) .................. 2023-024885

(51) Int. Cl.
| | |
|---|---|
| *G02F 1/13357* | (2006.01) |
| *G02F 1/1335* | (2006.01) |
| *H01L 25/075* | (2006.01) |
| *H01L 33/00* | (2010.01) |
| *H01L 33/52* | (2010.01) |
| *H01L 33/54* | (2010.01) |
| *H01L 33/60* | (2010.01) |

(52) U.S. Cl.
CPC .. *G02F 1/133605* (2013.01); *G02F 1/133603* (2013.01); *H01L 25/0753* (2013.01); *H01L 33/52* (2013.01); *H01L 33/60* (2013.01); *H01L 2933/0058* (2013.01)

(58) Field of Classification Search
CPC ......... G02F 1/133605; G02F 1/133603; G02F 1/133612; H01L 25/0753; H01L 33/52; H01L 33/60; H01L 2933/0058
USPC .................................................. 313/500–512
See application file for complete search history.

(56) References Cited

U.S. PATENT DOCUMENTS

| | | | |
|---|---|---|---|
| 2009/0146155 A1* | 6/2009 | Wang ..................... | H01L 31/14 257/82 |
| 2013/0037830 A1* | 2/2013 | Jang ........................ | H01L 33/60 257/E33.056 |
| 2018/0045395 A1* | 2/2018 | Kamada ............ | G02F 1/133603 |

(Continued)

FOREIGN PATENT DOCUMENTS

CN            114428421 A  *  5/2022

OTHER PUBLICATIONS

Li, CN114428421, machine translation, Mar. 2022 (Year: 2022).*

*Primary Examiner* — Tracie Y Green
(74) *Attorney, Agent, or Firm* — ScienBiziP, P.C.

(57) ABSTRACT

A lighting device includes a substrate, a first conductive portion, a second conductive portion disposed with a spacing as to the first conductive portion, a first reflective layer having a first opening coinciding with the first conductive portion and a second opening coinciding with the second conductive portion, a light-emitting part connected to the first conductive portion through the first opening, a non-light-emitting part connected to the second conductive portion through the second opening, and a second reflective layer. The second reflective layer includes a first reflective portion disposed around the light-emitting part, and a second reflective portion disposed around the non-light-emitting part.

16 Claims, 11 Drawing Sheets

(56) References Cited

U.S. PATENT DOCUMENTS

2019/0113208 A1* 4/2019 Chan .................... F21V 9/32
2022/0163849 A1  5/2022 Tien et al.

\* cited by examiner

LIGHTING DEVICE, DISPLAY DEVICE, AND METHOD OF MANUFACTURING LIGHTING DEVICE

BACKGROUND

1. Field

The technology disclosed in the present specification relates to a lighting device, a display device, and a method of manufacturing the lighting device.

2. Description of the Related Art

A backlight device described in U.S. Patent Application Publication No. 2022/0163849 is conventionally known as an example of a backlight device used for a liquid crystal display device. The backlight device described in U.S. Patent Application Publication No. 2022/0163849 has a light-emitting diode (LED) substrate. The LED substrate includes a wiring layer, a first reflective layer, and a second reflective layer, upon a base material, and LEDs are mounted in opening portions of the first reflective layer. The second reflective layer is formed in a range from Din to Dout around the LEDs.

In recent years, there are cases of demand for mounting LED drivers on LED substrates. When considering mounting the LED drivers on the LED substrate described in U.S. Patent Application Publication No. 2022/0163849, the second reflective layer is disposed around the LEDs in the structure in U.S. Patent Application Publication No. 2022/0163849, and accordingly there is a problem of a heightwise gap being formed between around the LEDs, and around the LED drivers. There is concern that such a heightwise gap could be problematic in manufacturing.

It is desirable to resolve the problem in manufacturing due to the heightwise gap.

SUMMARY

According to technology described in the present specification, there is provided a lighting device including a substrate that has a first principal face, a first conductive portion that is provided on the first principal face of the substrate, a second conductive portion that is provided on the first principal face of the substrate and that is disposed with a spacing as to the first conductive portion, a first reflective layer that is provided on the first principal face of the substrate and that has a first opening coinciding with the first conductive portion and a second opening coinciding with the second conductive portion, a light-emitting part that is attached on the first principal face of the substrate and that is connected to the first conductive portion through the first opening, a non-light-emitting part that is attached on the first principal face of the substrate and that is connected to the second conductive portion through the second opening, and a second reflective layer that is provided on the first reflective layer. The second reflective layer includes a first reflective portion disposed around the light-emitting part, and a second reflective portion disposed around the non-light-emitting part.

According to technology described in the present specification, there is provided a display device including the lighting device according to the above aspect, and a display panel that performs display using light from the lighting device.

According to technology described in the present specification, there is provided a method of manufacturing a lighting device, the method including providing a first reflective layer that has a first opening and a second opening that is provided with a spacing as to the first openings, on a first principal face of a substrate, providing a second reflective layer that has a first reflective portion disposed around the first opening and a second reflective portion disposed around the second opening, on the first reflective layer, providing a first conductive portion that coincides with the first opening, and a second conductive portion that coincides with the second opening, on the first principal face of the substrate, and attaching a light-emitting part that is connected to the first conductive portion through the first opening, and a non-light-emitting part that is connected to the second conductive portion through the second opening, onto the first principal face of the substrate.

BRIEF DESCRIPTION OF THE DRAWINGS

FIG. 3 is a plan view of a light-emitting diode (LED) substrate making up a backlight device that the liquid crystal display device according to the first embodiment is equipped with;

DESCRIPTION OF THE EMBODIMENTS

First Embodiment

Figure 1:
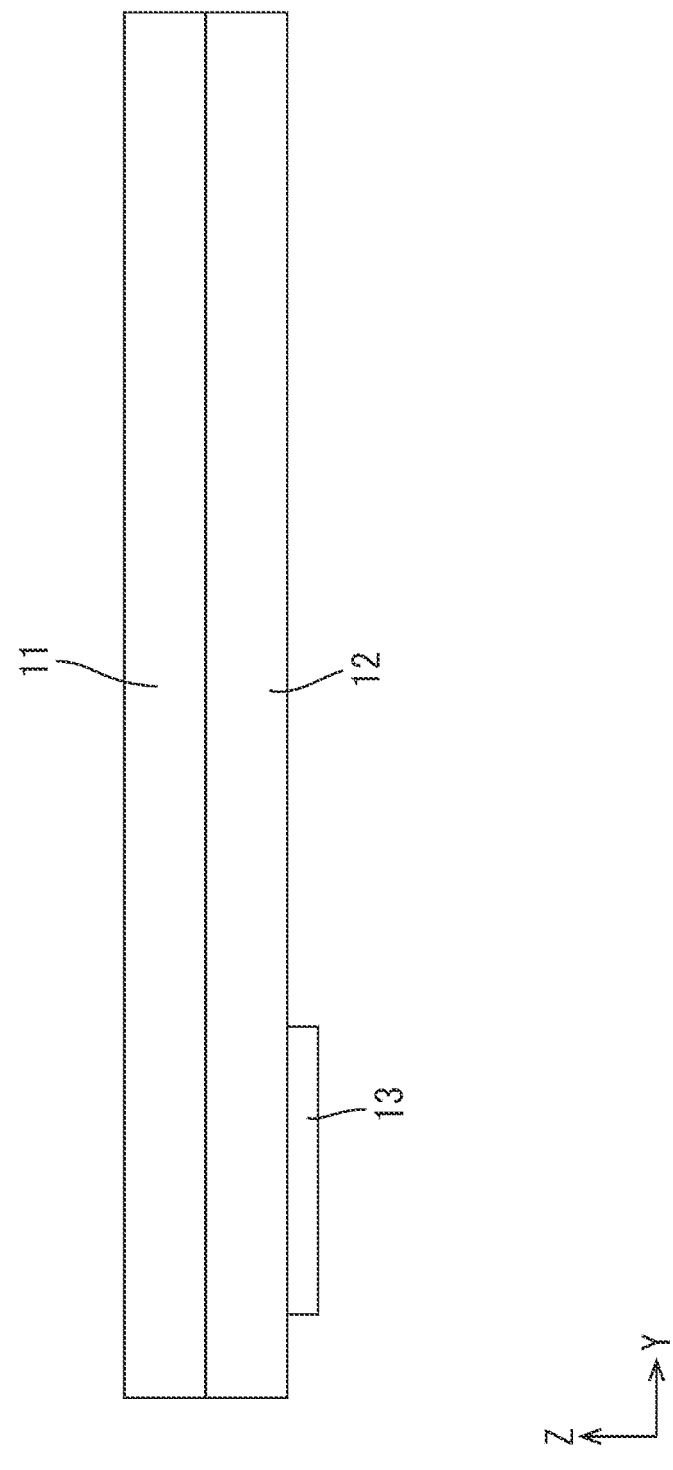
FIG. 1 is a schematic side view of a liquid crystal display device according to a first embodiment.
Figure 2:
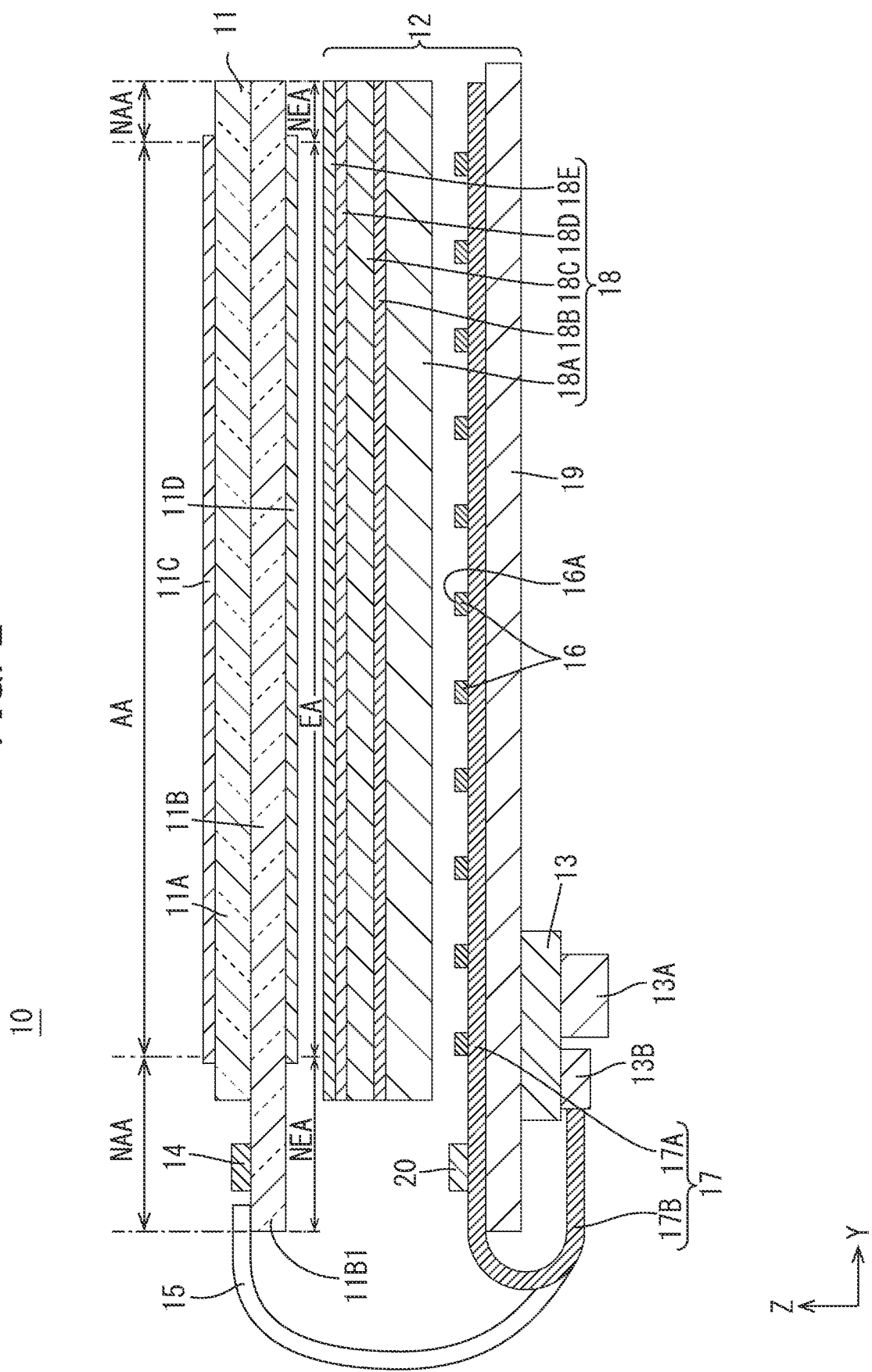
FIG. 2 is a cross-sectional view of the liquid crystal display device according to the first embodiment.
Figure 3:
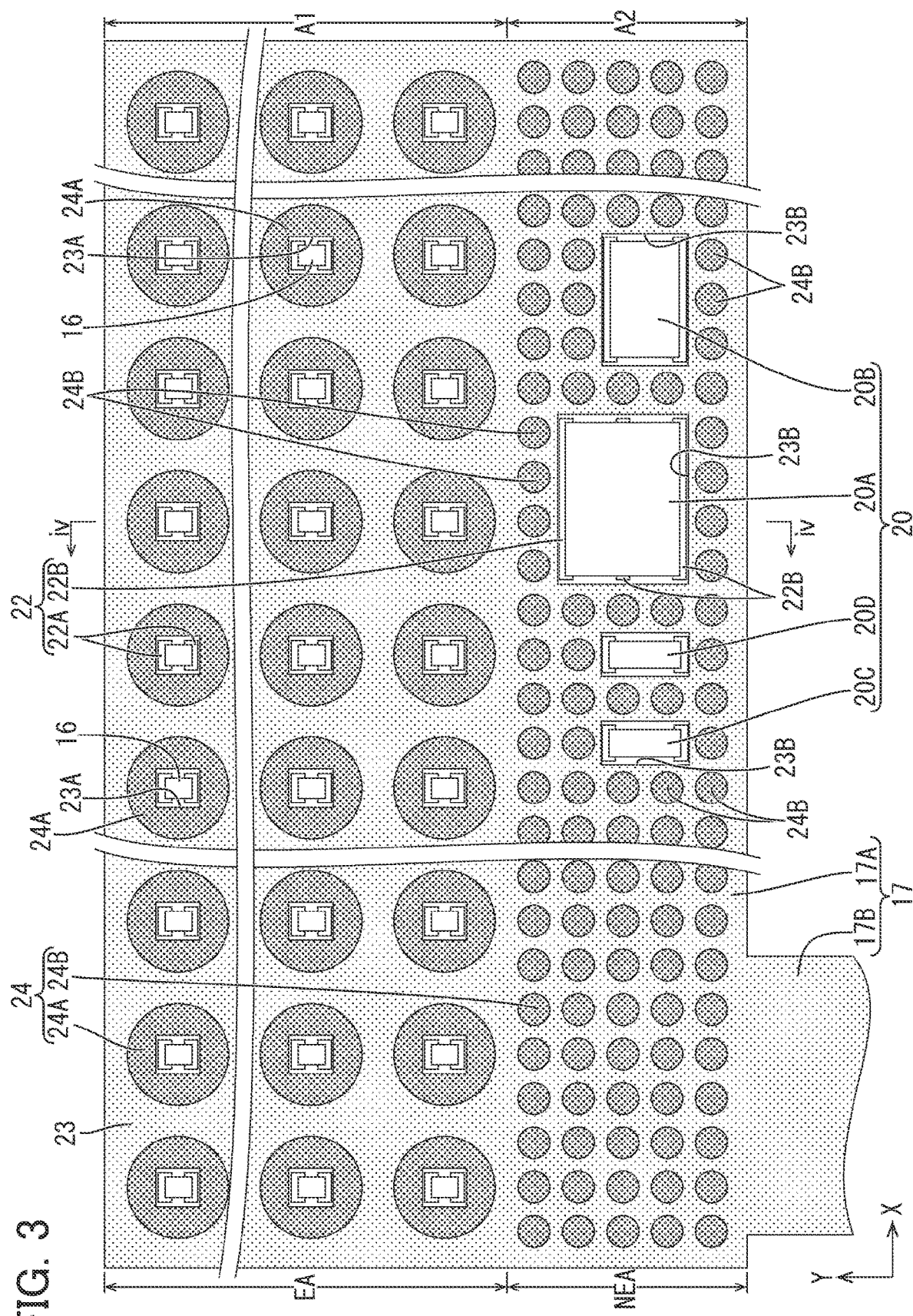

A first embodiment will be described with reference to FIGS. 1 to 6. A liquid crystal display device (display device) 10 is exemplified in the present embodiment. Note that part of the drawings show an X axis, a Y axis, and a Z axis, illustrated such that the axial directions are the directions in the drawings. Also, an upper side in FIGS. 1 and 3 is a front side, and a lower side therein is a rear side.

A schematic configuration of the liquid crystal display device 10 will be described with reference to FIG. 1. As illustrated in FIG. 1, the liquid crystal display device 10 includes a liquid crystal panel (display panel) 11 that displays images, a backlight device (lighting device) 12 that supplies light to the liquid crystal panel 11 for displaying, and a control board (external board) 13 that supplies electric power, various types of signals, and so forth, to the liquid crystal panel 11 and the backlight device 12.

Configurations of the liquid crystal panel 11, the backlight device 12, and the control board 13 will be described mostly with reference to FIG. 2. The liquid crystal panel 11 has, as illustrated in FIG. 2, a pair of substrates 11A and 11B that are bonded to each other, and a liquid crystal layer that is sealed in between the pair of substrates 11A and 11B. Of the pair of substrates 11A and 11B, the one on a front side (front-face side) thereof is a counter substrate 11A, and the one on a rear side (rear-face side) thereof is an array substrate 11B. Provided on the counter substrate 11A are color filters having colors such as red (R), green (G), blue (B), and so forth, and light-shielding portions (black matrix) partitioning between the color filters that are adjacent, and so forth. The array substrate 11B is provided with at least gate lines and source lines that are orthogonal to each other, switching devices (e.g., thin-film transistors (TFT)) connected to the gate lines and the source lines, and pixel electrodes connected to the switching devices to make up pixels. Note that alignment films are each provided on inner faces of the counter substrate 11A and the array substrate 11B. Also, polarizing plates 11C and 11D are attached to each outer face of the counter substrate 11A and the array substrate 11B, respectively.

A middle-side portion of a principal face of the liquid crystal panel 11 is a display region AA where images are displayed, and a peripheral-side portion that surrounds the display region AA is a non-display region NAA where no images are displayed. The array substrate 11B is larger in size than the counter substrate 11A, and a portion thereof is a jutting portion 11B1 that juts out sidewards with respect to the counter substrate 11A. The jutting portion 11B1 is not covered by the counter substrate 11A and is exposed. The entire region of the jutting portion 11B1 is the non-display region NAA, and a source driver (liquid crystal panel driver) 14 and a flexible board 15 for supplying various types of signals are mounted thereupon. The source driver 14 is made up of a large-scale integration (LSI) chip that has a drive circuit therein. The source driver 14 is chip-on-glass (COG) mounted to the jutting portion 11B1 of the array substrate 11B. The source driver 14 processes various types of signals transmitted by the flexible board 15. The flexible board 15 is configured by a great number of wiring patterns being formed on a base material that is electrically insulating and also is flexible. The flexible board 15 is overall bent back on itself, with one end side thereof connected to the array substrate 11B, and the other end side thereof connected to the control board 13, respectively. Various types of signals supplied from the control board 13 are transmitted to the liquid crystal panel 11 via the flexible board 15.

The backlight device 12 is a so-called downright backlight device, as illustrated in FIG. 2, with a principal face that emits light (light-emitting principal face) facing a principal face on a rear side of the liquid crystal panel 11. A middle-side portion of the backlight device 12 that coincides with the display region AA of the liquid crystal panel 11 in plan view is a light-emitting region EA that emits light. An outer peripheral-side portion of the backlight device 12 that coincides with the non-display region NAA of the liquid crystal panel 11 in plan view is a non-light-emitting region NEA where hardly any light is emitted. More specifically, as illustrated in FIG. 2, the backlight device 12 includes at least light-emitting diodes (LED) 16 that are light-emitting parts (light source), an LED substrate 17 that is a light-source substrate on which a plurality of LEDs 16 are mounted, an optical member 18 that imparts light emitted from the LEDs 16 with optical effects, and a chassis 19 that accommodates the LED substrate 17 and the optical member 18. Of these, the chassis 19 is made of metal or synthetic resin, is rigid, and has a plate-like form.

Each of the LEDs 16 is a so-called top-emitting LED, which is surface-mounted on the LED substrate 17 with a light-emitting face 16A thereof facing the opposite side (front side, optical member 18 side) from the LED substrate 17 side, as illustrated in FIG. 2. An optical axis of the LED 16 agrees with a Z axis direction. The term "optical axis" as used here means an axis that agrees with the direction of travel of light of which emission intensity is the highest (that is the peak) out of the emitted light of the LED 16. In the present embodiment, a blue LED that emits blue monochromatic light is used as the LEDs 16. The blue LED has an LED chip that emits monochromatic light of blue light. For example, "ES-FEBCPE10E" that is manufactured by Epistar Corp., or the like, can be used as the blue LED. In a case of using "ES-FEBCPE10E" as the blue LED, the dominant emission wavelength of blue light is around 450 nm, and the planar shape is rectangular, with a short side dimension of around 0.25 mm and a long side dimension of around 0.53 mm. A configuration may be made regarding the LEDs 16 in which LED chips are sealed by a sealing material on a board portion mounted on the LED substrate 17. Alternatively, the LEDs 16 may be a so-called chip-scale package (CSP).

As illustrated in FIG. 2, the LED substrate 17 is disposed on a principal face side on a front side of the chassis 19, and is supported by the chassis 19 from the rear side thereof. Of principal faces of the LED substrate 17, the plurality of LEDs 16 are surface-mounted on the principal face that faces the front side, which is a mounting face. The plurality of LEDs 16 may be disposed arrayed in a matrix at positions each separated by spacings in each of the X axis direction and the Y axis direction on the principal face on the front side of the LED substrate 17. A detailed configuration of the LED substrate 17 will be described again later.

The optical member 18 includes five sheets that are layered on each other in the Z axis direction, as illustrated in FIG. 2. The five optical members 18 are, in order from the rear side thereof, a diffusion plate 18A, a diffusion sheet 18B, a wavelength conversion sheet 18C, and two prism sheets 18D and 18E. The diffusion plate 18A has a greater thickness than the other optical members 18B to 18E, is configured with a great number of diffusion particles dispersed in a base material made of resin that is approximately transparent, and has functions of diffusing light passing therethrough. A principal face on a rear side of the diffusion plate 18A faces the light-emitting faces 16A of the LEDs 16. Light emitted from the light-emitting faces 16A of the LEDs 16 is diffused by the diffusion particles contained in the diffusion plate 18A, as it is being emitted toward the front side. The diffusion sheet 18B has a configuration in which a great number of minute recessed portions are provided on a principal face on a rear side of a base material that is approximately transparent. The recessed portions are shaped as four-sided pyramids (pyramid shapes), a plurality of which are arrayed in a matrix in the X axis direction and the Y axis direction in tessellation on the principal face on the rear side of the diffusion sheet 18B. Light emitted from the diffusion plate 18A is diffused by being refracted at inclined faces of the recessed portions in the diffusion sheet 18B, as it is being emitted toward the front side.

As illustrated in FIG. 2, the wavelength conversion sheet 18C has a configuration in which a fluorescent layer containing a fluorescent substance is provided on a transparent base material. The fluorescent layer of the wavelength conversion sheet 18C contains a fluorescent substance that uses the blue light from the LEDs 16 that are blue LEDs (primary light) as excitation light, and emits secondary light. The fluorescent substance includes a green fluorescent substance that emits green light as secondary light, and a red fluorescent substance that emits red light as secondary light. The green fluorescent substance and the red fluorescent substance down-conversion types (down-shifting types) of which excitation wavelengths are shorter wavelengths than fluorescence wavelengths, and may be, for example, Quantum Dot Phosphors, inorganic fluorescent substances, organic fluorescent substances, or the like. The light emitted from the wavelength conversion sheet 18C contains the blue light from the LEDs 16, and the green light and the red light due to wavelength conversion by the green fluorescent substance and the red fluorescent substance, and exhibits a substantially white color through additive color mixing.

The two prism sheets 18D and 18E each have prisms that are orthogonal to each other, as illustrated in FIG. 2. One of the two prism sheets 18D and 18E has a configuration in which a great number of prisms extending in the X axis direction are arrayed in the Y axis direction. This one of the two prism sheets 18D and 18E can selectively impart light collecting effects with respect to the Y axis direction that is the direction of array of the prisms. The other of the two prism sheets 18D and 18E has a configuration in which a great number of prisms extending in the Y axis direction are provided arrayed in the X axis direction. This other of the two prism sheets 18D and 18E can selectively impart light collecting effects with respect to the X axis direction that is the direction of array of the prisms. Thus, light collecting effects with respect to the X axis direction and the Y axis direction can be imparted to light emitted from the wavelength conversion sheet 18C by the two prism sheets 18D and 18E, and accordingly improved front luminance can be achieved with regard to emitted light of the backlight device 12. A principal face on a front side of the prism sheet 18E that is disposed on the front side, out of the two prism sheets 18D and 18E, makes up the light-emitting principal face of the backlight device 12. The two prism sheets 18D and 18E may be bonded to each other. Note that "Brightness Enhancement Film (BEF)" that is a product of the 3M Company, for example, can be used as the prism sheets 18D and 18E.

The control board 13 is disposed over the rear side of the chassis 19 (on the opposite side from the LED substrate 17), as illustrated in FIG. 2. The control board 13 has a configuration in which a plurality of circuit parts 13A are mounted on a rigid board made of synthetic resin (e.g., made of phenolic paper, made of glass epoxy resin, or the like). The plurality of circuit parts 13A includes a power source integrated circuit (IC) for outputting electric power, a driver control IC for controlling the source driver 14 and a later-described LED driver, and so forth. The control board 13 has a connector portion 13B to which the flexible board 15 and the LED substrate 17 are connected. The control board 13 performs local dimming control and high dynamic range (HDR) control of the liquid crystal panel 11 and the backlight device 12.

A detailed configuration of the LED substrate 17 will be described with reference to FIGS. 2 to 4. As illustrated in FIG. 3, the LED substrate 17 may have a substrate main body 17A of which the planar shape is approximately rectangular that is laterally elongated. Note that the planar shapes of the liquid crystal panel 11, the optical member 18, and the chassis 19 also are approximately rectangular shapes that are laterally elongated, in the same way as with the substrate main body 17A of the LED substrate 17. In the present embodiment, 64 LEDs 16 are each provided in the X axis direction on a principal face on a front side of the substrate main body 17A of the LED substrate 17, and 32 each in the Y direction, for a total count of 2,048 LEDs 16. The array spacing of the LEDs 16 in the X axis direction is around 5.37 mm. The array spacing of the LEDs 16 in the Y axis direction is around 6.06 mm.

The LED substrate 17 may have a bent portion 17B that extends sidewards from the substrate main body 17A, as illustrated in FIGS. 2 and 3. Specifically, of an outer end of the substrate main body 17A, the bent portion 17B forms a band that extends in the Y axis direction, from a portion coinciding with the jutting portion 11B1 of the array substrate 11B of the liquid crystal panel 11. The bent portion 17B has a bent-back form by being bent toward a rear side of the chassis 19. An extending end portion of the bent portion 17B is inserted into the connector portion 13B of the control board 13 at the rear side of the chassis 19. A terminal to be connected to the connector portion 13B is provided on the extending end portion of the bent portion 17B.

As illustrated in FIGS. 2 and 3, the substrate main body 17A of the LED substrate 17 is disposed across the light-emitting region EA and the non-light-emitting region NEA of the backlight device 12. Conversely, the entire region of the bent portion 17B is disposed in the non-light-emitting region NEA. The plurality of LEDs 16 are attached in a range of the substrate main body 17A that coincides with the light-emitting region EA. Non-light-emitting parts 20 that do not emit light like the LEDs 16 do are attached in a range of the substrate main body 17A that coincides with the non-light-emitting region NEA. A plurality of the non-light-emitting parts 20 are disposed distributed with spacings therebetween in the X axis direction on the substrate main body 17A. Each of the non-light-emitting parts 20 includes an LED driver (driving part) 20A, a switch IC 20B, a capacitor 20C, a resistor 20D, and so forth. The plurality of non-light-emitting parts 20 have different sizes in plan view depending on the type, but all are larger in size in plan view than the LEDs 16. Of these, the LED driver 20A can drive the LEDs 16 on the basis of signals supplied from the control board 13. For example, "MBI6334", which is a product of Macroblock, or the like, can be used for the LED driver 20A. One "MBI6334" is capable of driving 512 LEDs. Accordingly, four LED drivers 20A are attached to the LED substrate 17 according to the present embodiment. The LEDs 16 are controlled to on/off by the LED drivers 20A, and also the amount of light emitted when on is controlled as well. As described above, providing the LED drivers 20A on the substrate main body 17A of the LED substrate 17 does away with the need to provide the LED drivers 20A on the control board 13. Thus, the size of the control board 13 can be reduced.

A detailed cross-sectional configuration of the LED substrate 17 will be described, mostly with reference to FIG. 4. As illustrated in FIG. 4, the LED substrate 17 has at least a substrate 21, a wiring layer 22 provided on a first principal face 21A on a front side of the substrate 21, a first reflective layer 23 that is layered on a front side of the wiring layer 22, and a second reflective layer 24 that is layered on a front side of the first reflective layer 23. The LED substrate 17 also has a rear-side wiring layer 25 provided on a second principal face 21B on a rear side of the substrate 21, and a rear-side resist layer 26 that is layered on a rear side of the rear-side wiring layer 25.

The substrate 21 is made up of a film that is made of synthetic resin (e.g., made of polyimide, made of polyethylene terephthalate (PET), or the like), and may be flexible. As illustrated in FIG. 4, the substrate 21 has the substrate main body 17A and the bent portion 17B, as described earlier. The wiring layer 22 and the rear-side wiring layer 25 are both made of a metal material with excellent conductivity (e.g., copper or the like). The wiring layer 22 and the rear-side wiring layer 25 are patterned so as to form predetermined routing paths over the substrate main body 17A and the bent portion 17B of the substrate 21. Electric current can be controlled and supplied to the plurality of LEDs 16 by the LED driver 20A and the switch IC 20B through the wiring layer 22 and the rear-side wiring layer 25. Of these, the wiring layer 22 includes first wiring 22A that is disposed so as to coincide with the light-emitting region EA and is connected to the LEDs 16, and second wiring 22B that is disposed so as to coincide with the non-light-emitting region NEA and is connected to the non-light-emitting parts 20.

The first reflective layer 23, the second reflective layer 24, and the rear-side resist layer 26 are each made up of solder resist that is made of an electrically insulating material. Of these, a solder resist that has a white color and has high optical reflectivity is used for the first reflective layer 23 and the second reflective layer 24 disposed on the front side of the substrate 21. An example of solder resist used for the first reflective layer 23 and the second reflective layer 24 is "RPW-300-13TR-1", which is a product manufactured by Tamura Corporation. The first reflective layer 23 and the second reflective layer 24 are each formed to a film thickness of around 25 μm, for example. Generally, white solder resist has a nature of exhibiting a higher optical reflectivity the greater the film thickness is, and accordingly the optical reflectivity can be raised in regions in which the first reflective layer 23 and the second reflective layer 24 are layered.

Figure 4:
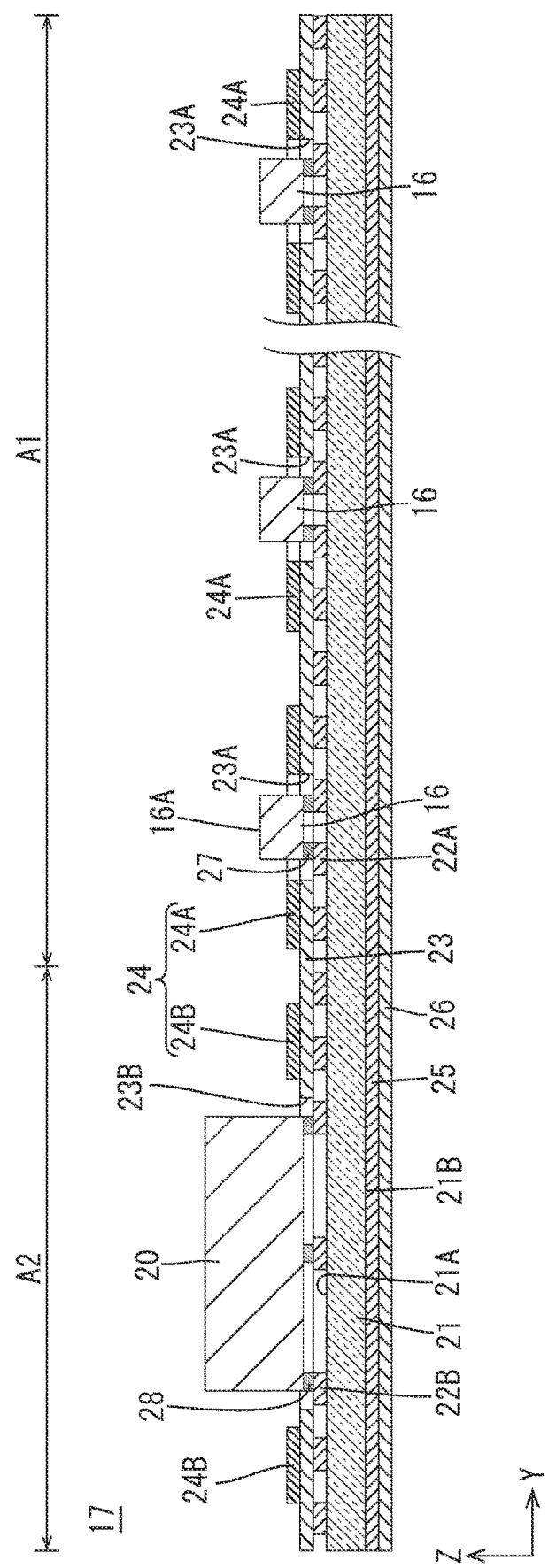
FIG. 4 is a cross-sectional view of the LED substrate according to the first embodiment, taken along line iv-iv in FIG. 3.

As illustrated in FIGS. 3 and 4, the first reflective layer 23 is provided over approximately the entire region of the substrate main body 17A and the bent portion 17B of the substrate 21. Note that in FIG. 3, formation ranges of each of the first reflective layer 23 and the second reflective layer 24 are indicated by different screening, with light (sparse) screening indicating the formation regions of the first reflective layer 23, and dark (dense) screening indicating the formation regions of the second reflective layer 24. Of the first reflective layer 23, portions coinciding with the light-emitting region EA in the substrate main body 17A (first region A1, which will be described later) are provided with first openings 23A that coincide with the LEDs 16. Of the first reflective layer 23, portions coinciding with the non-light-emitting region NEA in the substrate main body 17A (second region A2, which will be described later) are provided with second openings 23B that coincide with the non-light-emitting parts 20.

As illustrated in FIGS. 3 and 4, the first openings 23A are rectangular in planar shape, in the same way as with the LEDs 16 that are coinciding therewith, and the size thereof in plan view is slightly larger than that of the LEDs 16. A plurality of the first openings 23A may be disposed arrayed in a matrix each at positions with spacings therebetween in each of the X axis direction and the Y axis direction, in the same way as the array of the LEDs 16. The number of first openings 23A provided is the same as the number of the LEDs 16 provided. A portion of the first wiring 22A included in the wiring layer 22 is exposed at the first openings 23A. First conductive portions 27 that connect the LEDs 16 and the first wiring 22A are provided at positions coinciding with the first openings 23A. The first conductive portions 27 are made of, for example, cream solder (solder in a paste form) or the like. The first conductive portions 27 are provided in pairs that are placed in portions of the first wiring 22A exposed at the first openings 23A. Of the first conductive portions 27 making up a pair, one first conductive portion 27 is connected to an anode terminal provided on a bottom face of an LED 16, and the other first conductive portion 27 is connected to a cathode terminal provided on the bottom face of the LED 16.

The second openings 23B have the same planar shape as the non-light-emitting parts 20 that are coinciding therewith, as illustrated in FIGS. 3 and 4, and the size thereof in plan view is slightly larger than that of the non-light-emitting parts 20 coinciding therewith. The size of the non-light-emitting parts 20 in plan view is larger than that of the LEDs 16, as described earlier. Accordingly, the second openings 23B may have a larger opening area than that of the first openings 23A. A plurality of the second openings 23B are disposed distributed at positions with spacings therebetween in the X axis direction, in the same way as with the array of the non-light-emitting parts 20. The number of second openings 23B provided is the same as the number of non-light-emitting parts 20 provided. A portion of the second wiring 22B included in the wiring layer 22 is exposed at the second openings 23B. Second conductive portions 28 that connect the non-light-emitting parts 20 and the second wiring 22B are provided at positions coinciding with the second openings 23B. The second conductive portions 28 are made of the same material as that of the first conductive portions 27 (e.g., cream solder or the like). A plurality of the second conductive portions 28 are placed in portions of the second wiring 22B exposed at the second openings 23B. The plurality of second conductive portions 28 are connected to each of a plurality of terminals provided to bottom faces of the non-light-emitting parts 20.

As illustrated in FIGS. 3 and 4, the second reflective layer 24 includes first reflective portions 24A that are disposed around the LEDs 16. A greater amount of light emitted from the light-emitting faces 16A of the LEDs 16 and light reflected from the optical members 18 and so forth is present around the LEDs 16 where the first reflective portions 24A are disposed, as compared to positions away from the LEDs 16. Further, the first reflective layer 23 is layered on a lower-layer side of the first reflective portions 24A, and accordingly the optical reflectivity by the first reflective portions 24A can be increased as compared to portions where the first reflective layer 23 alone is present. Accordingly, the light emitted from the LEDs 16 can be efficiently reflected by the first reflective portions 24A disposed around the LEDs 16 so as to overlap the first reflective layer 23. Thus, usage efficiency of light can be improved.

As illustrated in FIG. 3, the first reflective portions 24A may have ring-like forms that extend along the first openings 23A. Specifically, the planar shapes of the first reflective portions 24A are approximately annular forms, and the first reflective portions 24A are disposed concentrically with the first openings 23A and the LEDs 16. While the planar shapes of the first reflective portions 24A at inner peripheral edges thereof are rectangular, the same as the planar shapes of the first openings 23A, the planar shapes at outer peripheral edges thereof are circular. The diameter of the outer peripheral edges of the first reflective portions 24A is around 3 mm, for example. It can also be said that the first reflective portions 24A have openings (fifth openings) that coincide with the first openings 23A and the LEDs 16. In this way, the first reflective portions 24A are disposed encompassing the entire peripheries of the LEDs 16. Light emitted from the LEDs 16 and light reflected by the optical members 18 and so forth can be efficiently reflected by the first reflective portions 24A, which have ring-like forms, surrounding the LEDs 16. Thus, usage efficiency of light can be further improved.

As illustrated in FIG. 3, a plurality of the first reflective portions 24A may be disposed arrayed in a matrix, each at positions with spacings therebetween in the X axis direction and the Y axis direction, in the same way as with the array of the first openings 23A and the LEDs 16. The plurality of first reflective portions 24A island-like and independent from each other, and do not connect to each other. In the plane of the first principal face 21A of the substrate 21, a single layer of the first reflective layer 23 is formed in a substantially grid-like region, and the first reflective portions 24A of the second reflective layer 24 are not formed. Specifically, a non-formation portion of the first reflective portions 24A forming a grid has a width of around 2.37 mm in the X axis direction, and a width of around 3.06 mm in the Y direction. Accordingly, in a case of stress acting on the substrate 21, the stress can be absorbed by the non-formation portion of the first reflective portions 24A. Thus, a situation in which the portion of the substrate 21 to which the plurality of LEDs 16 are attached does not readily flex due to the first reflective portions 24A can be averted more easily, and flexibility (ductility) of the portion of the substrate 21 to which the plurality of LEDs 16 are attached can be ensured. Ensuring flexibility of the substrate main body 17A of the substrate 21 makes cracking of the first reflective layer 23, the second reflective layer 24, and the rear-side resist layer 26 less likely to occur, and also makes line breakage of the wiring layers 22 and 25 less likely to occur. Also, the amount of material of the second reflective layer 24 that is used can be conserved as compared with a case of assuming that the first reflective portions are formed as a solid pattern in the same way as with the first reflective layer 23.

As illustrated in FIGS. 3 and 4, the second reflective layer 24 includes, in addition to the first reflective portions 24A described above, second reflective portions 24B that are disposed around the non-light-emitting parts 20. Now, assuming that the second reflective layer 24 is not formed around the non-light-emitting parts 20, a heightwise gap equivalent to the film thickness of the second reflective layer 24 (around 25 μm) will be formed between around the LEDs 16 and around the non-light-emitting parts 20 on an upper face of the first reflective layer 23. With respect to this point, the second reflective layer 24 includes the second reflective portions 24B disposed around the non-light-emitting parts 20 in addition to the first reflective portions 24A disposed around the LEDs 16, and accordingly a heightwise gap is not readily formed between around the LEDs 16 and around the non-light-emitting parts 20 on the upper face of the first reflective layer 23. Accordingly, in a case of employing procedures of providing the first reflective layer 23 and the second reflective layer 24 on the first principal face 21A of the substrate 21, and thereafter providing the first conductive portions 27 and the second conductive portions 28 when manufacturing the backlight device 12, the first conductive portions 27 and the second conductive portions 28 can be appropriately provided. Thus, the problem in manufacturing due to the heightwise gap is resolved.

As illustrated in FIG. 3, a plurality of the second reflective portions 24B may be disposed with spacings therebetween following the second openings 23B. Specifically, the plurality of second reflective portions 24B are arrayed so as to follow the outer shapes of the non-light-emitting parts 20 in plan view. The second reflective portions 24B have planar shapes that are circular, and the diameter thereof is smaller than the diameter of the outer peripheral edge of the first reflective portions 24A. The diameter of the second reflective portions 24B is around 0.5 mm, for example. The spacing between the second reflective portions 24B that are adjacent (array spacing) is around 1 mm, for example. Also, the plurality of second reflective portions 24B arrayed around the non-light-emitting parts 20 are each disposed with spacings as to the non-light-emitting parts 20 and the second openings 23B. That is to say, the second reflective portions 24B are not formed over an entire periphery of opening edges of the second openings 23B. Thus, on the first principal face 21A of the substrate 21, there are portions around the non-light-emitting part 20 where the first reflective layer 23 is a single layer, and the second reflective portions 24B of the second reflective layer 24 are not formed in these portions. Accordingly, in a case of stress acting on the substrate 21, the stress can be absorbed by the non-formation portion of the second reflective portions 24B. Thus, a situation in which the portion of the substrate 21 to which the non-light-emitting parts 20 are attached does not readily flex due to the second reflective portions 24B can be averted more easily, and flexibility of the portion of the substrate 21 to which the non-light-emitting parts 20 are attached can be ensured. Also, the amount of material of the second reflective layer 24 that is used can be conserved as compared with a case of assuming that the second reflective portions are extend in ring-like forms following the second openings 23B. In the present embodiment, the opening area of the second openings 23B may be larger than the opening area of the first openings 23A, and accordingly the amount of material of the second reflective layer 24 that is used can be further conserved.

Also, as illustrated in FIG. 3, in a range of the substrate main body 17A coinciding with the non-light-emitting region NEA (latter-described second region A2), the second reflective portions 24B are disposed not only around the non-light-emitting parts 20 and the second openings 23B, but also in a range where the non-light-emitting parts 20 and the second openings 23B are not present. The plurality of second reflective portions 24B are arrayed in a matrix each at positions with spacings therebetween in each of the X axis direction and the Y axis direction in the range of the substrate main body 17A coinciding with the non-light-emitting region NEA. Thus, the plurality of second reflective portions 24B are disposed throughout the range of the substrate main body 17A coinciding with the non-light-emitting region NEA, and accordingly a heightwise gap is not readily formed between portions coinciding with the light-emitting region EA and portions coinciding with the non-light-emitting region NEA on the upper face of the first reflective layer 23. Accordingly, in a case of employing procedures of providing the first reflective layer 23 and the second reflective layer 24 on the first principal face 21A of the substrate 21, and thereafter providing the first conductive portions 27 and the second conductive portions 28 when manufacturing the backlight device 12, the first conductive portions 27 and the second conductive portions 28 can be provided even more appropriately.

As illustrated in FIG. 3, the second reflective portions 24B are far smaller in diameter as compared to the first reflective portions 24A, and also are not present at the opening edges of the second openings 23B. Now, when sectioning the upper face of the first reflective layer 23 into the first region A1 that is around the LEDs 16 and the second region A2 that is around the non-light-emitting parts 20, a first coverage proportion of the first reflective portions 24A covering the first region A1 may be greater than a second coverage proportion of the second reflective portions 24B covering the second region A2. The term "coverage proportion" as used here is a proportion obtained by dividing an area of the upper face of the first reflective layer 23 by a disposing region where the second reflective layer 24 is disposed (formation region) by a sum of an area of the above disposing region and an area of a non-disposing region where the second reflective layer 24 is not disposed (non-formation region). This coverage proportion can also be said to be distribution density of the second reflective layer 24. Note that the first region A1 is in a relation of coinciding with the light-emitting region EA, and the second region A2 is in a relation of coinciding with the non-light-emitting region NEA. Thus, due to the first coverage proportion being greater than the second coverage proportion, the area of the first reflective layer 23 covered by the second reflective layer 24 in the first region A1 is greater than the area of the first reflective layer 23 covered by the second reflective layer 24 in the second region A2. Accordingly, the light from the LEDs 16 can be reflected by the first reflective portions 24A of the second reflective layer 24 more efficiently in the first region A1. Thus, the usage efficiency of light can be further improved. On the other hand, the second coverage proportion is lower than the first coverage proportion, and accordingly the area of the first reflective layer 23 that is not covered by the second reflective layer 24 and is exposed in the second region A2 is greater than the area of the first reflective layer 23 that is not covered by the second reflective layer 24 and is exposed in the first region A1. Accordingly, a situation in which the portion of the substrate 21 to which the non-light-emitting parts 20 are attached does not readily flex due to the second reflective portions 24B can be averted more readily. This is suitable in ensuring flexibility of the substrate 21.

As illustrated in FIGS. 3 and 4, the second reflective layer 24 may be provided on the substrate main body 17A of the substrate 21 but not formed on the bent portion 17B. This enables a higher level of flexibility to be ensured for the bent portion 17B, in comparison with the substrate main body 17A. Accordingly, when the bent portion 17B is being bent toward the rear side of the chassis 19 when manufacturing the backlight device 12, a situation in which bending is impeded due to the second reflective layer 24 can readily averted. Thus, ensuring flexibility of the bent portion 17B of the substrate 21 makes cracking of the first reflective layer 23, the second reflective layer 24, and the rear-side resist layer 26 less likely to occur, and makes line breakage of the wiring layers 22 and 25 less likely to occur.

The present embodiment is configured as described above. Next, a manufacturing method of the backlight device 12 will be described. Manufacturing of the backlight device 12 is performed by manufacturing the components of the backlight device 12 and assembling the components that are manufactured. Specifically, at the time of manufacturing the backlight device 12, a plurality are manufactured of each of the LEDs 16 and the non-light-emitting parts 20, and also the LED substrate 17 is manufactured, following which the plurality of each of the LEDs 16 and the non-light-emitting parts 20 are attached to the substrate main body 17A of the LED substrate 17. The LED substrate 17 to which the LEDs 16 and the non-light-emitting parts 20 are attached is accommodated in the chassis 19. The optical member 18 and so forth are accommodated in the chassis 19.

The process of attaching the LEDs 16 and the non-light-emitting parts 20 to the LED substrate 17 will be described with reference to FIGS. 5 and 6. First, at the time of manufacturing the LED substrate 17, the wiring layer 22, the first reflective layer 23, and the second reflective layer 24 are sequentially provided on the first principal face 21A of the substrate 21, and the rear-side wiring layer 25 and the rear-side resist layer 26 are sequentially provided on the second principal face 21B of the substrate 21. The configurations of the wiring layer 22, the first reflective layer 23, the second reflective layer 24, the rear-side wiring layer 25, and the rear-side resist layer 26, which are provided on the substrate 21, are as described earlier.

The first conductive portions 27 and the second conductive portions 28 are provided on the LED substrate 17 that is manufactured, by silk screen printing. Now, a configuration of a mask 50 that is used in the silk screen printing will be describe with reference to FIG. 5. As illustrated in FIG. 5, the mask 50 is a metal mask made of a metal plate material, and the plate thickness thereof is around 100 μm. The plate thickness of the mask 50 is greater than the film thickness of the first reflective layer 23 (around 25 μm) or the film thickness of the second reflective layer 24 (around 25 μm). The mask 50 has a principal face that is parallel to the first principal face 21A of the substrate 21. Fourth openings 50A and fifth openings 50B are provided in the mask 50. A plurality of the fourth openings 50A are laid out at positions coinciding with each of the plurality of first openings 23A provided to the first reflective layer 23. The number of the fourth openings 50A coinciding with one first opening 23A is two, which agrees with the number of terminals provided on the bottom faces of the LEDs 16. The two fourth openings 50A are each disposed so as to coincide with the portion of the first wiring 22A that is exposed at the first opening 23A. A plurality of the fifth openings 50B are laid out at positions coinciding with each of the plurality of second openings 23B provided to the first reflective layer 23. The number of the fifth openings 50B coinciding with one second opening 23B agrees with the number of terminals provided on the bottom faces of the non-light-emitting parts 20. The plurality of fifth openings 50B are disposed so as to coincide with the portions of the second wiring 22B exposed at the second openings 23B.

Figure 5:
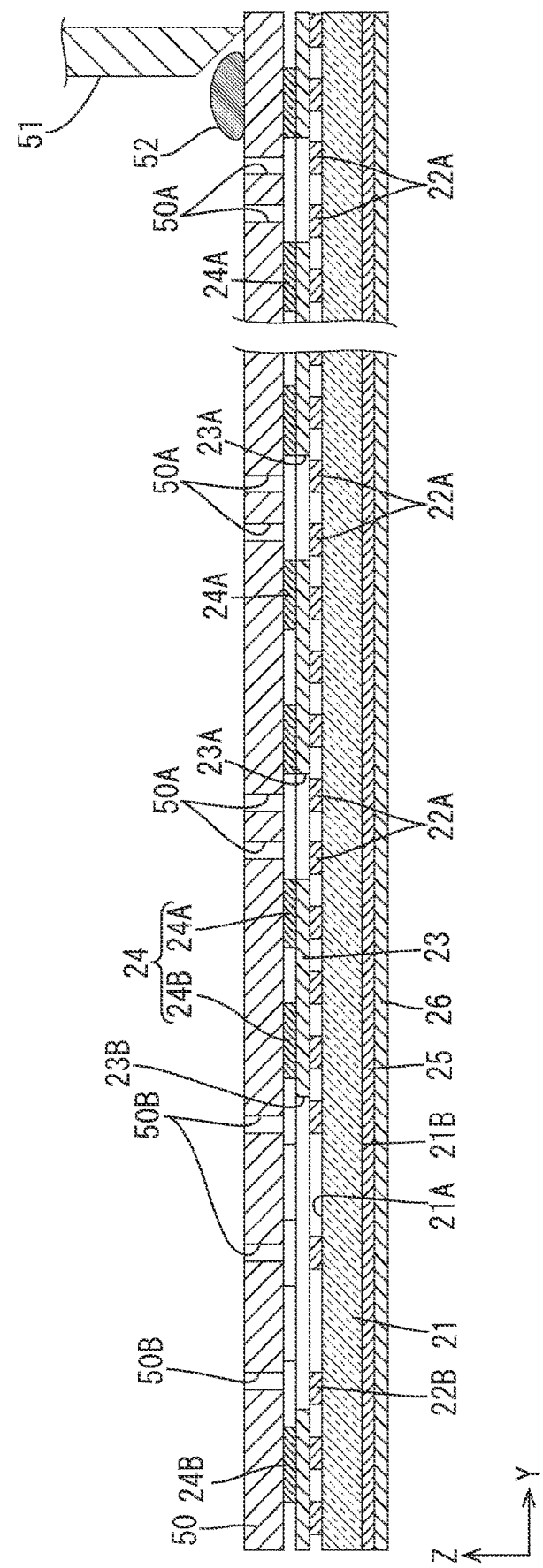
FIG. 5 is a cross-sectional view at the same cross-section position as in FIG. 4, illustrating a state in which a mask is set on a second reflective layer, and cream solder is supplied onto the mask, in a process of attaching LEDs and non-light-emitting parts to the LED substrate according to the first embodiment.

As illustrated in FIG. 5, the mask 50 according to the above configuration is set upon the first principal face 21A of the substrate 21 of the LED substrate 17 that is manufactured. Cream solder 52, which is the material of the first conductive portions 27 and the second conductive portions 28, is supplied onto the mask 50 that is set. A squeegee 51 disposed on the mask 50 is then moved along the principal face of the mask 50 in a state of being pressed against the mask 50. Thus, as illustrated in FIG. 6, the cream solder 52 is coated onto the first principal face 21A of the substrate 21 through the fourth openings 50A and the fifth openings 50B. The cream solder 52 that passes through the fourth openings 50A is placed on the portions of the first wiring 22A exposed at the first openings 23A, through the first openings 23A of the first reflective layer 23, and thereby form the first conductive portions 27. The cream solder 52 that passes through the fifth openings 50B is placed on the portions of the second wiring 22B exposed at the second openings 23B, through the second openings 23B of the first reflective layer 23, and thereby forms the second conductive portions 28. As described above, the first conductive portions 27 coinciding with the first openings 23A, and the second conductive portions 28 coinciding with the second openings 23B, are provided on the first principal face 21A of the substrate 21.

The attitude of the mask 50 set on the first principal face 21A of the substrate 21 will be described in detail. As illustrated in FIGS. 5 and 6, the mask 50 set on the first principal face 21A of the substrate 21 is supported from the rear side thereof by the first reflective portions 24A of the second reflective layer 24 around the first openings 23A (first region A1), and is supported from the rear side thereof by the second reflective portions 24B of the second reflective layer 24 around the second openings 23B (second region A2). Now, assuming that the second reflective layer 24 is not formed around the second openings 23B, the mask 50 will be supported from the rear side thereof by the first reflective layer 23 around the second openings 23B. That is to say, a gap equivalent to the film thickness of the second reflective layer 24 is formed in the height at which the mask 50 is supported between around the first openings 23A and around the second openings 23B. Accordingly, deformation such as warping, flexing, and so forth of the mask 50 that is set occurs. When deformation such as warping, flexing, and so forth of the mask 50 occurs, the cream solder 52 may not be coated at appropriate positions on the first principal face 21A of the substrate 21, or the amount coated may be insufficient.

Figure 6:
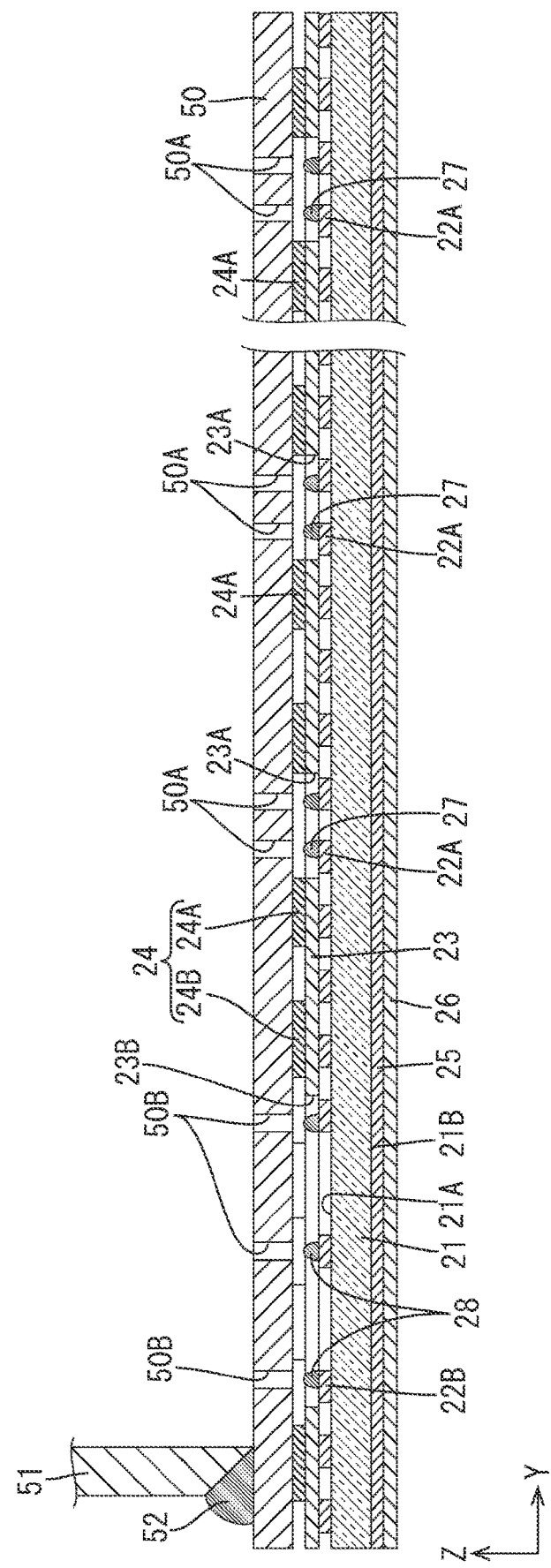
FIG. 6 is a cross-sectional view at the same cross-section position as in FIG. 4, illustrating a state in which a squeegee is moved and first conductive portions and second conductive portions are provided, in the process of attaching the LEDs and the non-light-emitting parts to the LED substrate according to the first embodiment.

With respect to this point, as illustrated in FIGS. 5 and 6, the second reflective layer 24 includes the first reflective portions 24A disposed around the first openings 23A and the second reflective portions 24B disposed around the second openings 23B, and accordingly a gap in the height at which the mask 50 is supported does not readily occur between around the first openings 23A and around the second openings 23B. Thus, when the mask 50 is set on the second reflective layer 24, the mask 50 is readily maintained at an approximately flat state, by being supported by the first reflective portions 24A around the first openings 23A and by being supported by the second reflective portions 24B around the second openings 23B. Deformation such as warping, flexing, and so forth of the mask 50 does not readily occur at either of around the first openings 23A and around the second openings 23B. The material of the first conductive portions 27 and the second conductive portions 28 is coated on appropriate positions on the first principal face 21A of the substrate 21 through the fourth openings 50A and the fifth openings 50B, and the amount coated thereof is also sufficient. Thus, the problem in manufacturing due to the heightwise gap is resolved.

Once the first conductive portions 27 and the second conductive portions 28 are provided as described above, the LEDs 16 and the non-light-emitting parts 20 are mounted on the first principal face 21A of the substrate 21. The LEDs 16 are mounted at positions coinciding with the first openings 23A of the first reflective layer 23, and accordingly the two terminals provided on the bottom faces thereof are in a state of being in contact with the two first conductive portions 27. The non-light-emitting parts 20 are mounted at positions coinciding with the second openings 23B of the first reflective layer 23, and accordingly the plurality of terminals on the bottom faces thereof are in a state of being in contact with the plurality of second conductive portions 28. When the LED substrate 17 is placed in a reflow oven in this state and heated, the terminals provided on the bottom faces of the LEDs 16 are soldered to the first conductive portions 27 respectively, and also the terminals provided on the bottom faces of the non-light-emitting parts 20 are soldered to the second conductive portions 28 respectively. Thus, the LEDs 16 and the non-light-emitting parts 20 are attached to the LED substrate 17.

As described above, the backlight device (lighting device) 12 according to the present embodiment includes the substrate 21 that has the first principal face 21A, the first conductive portions 27 that are provided on the first principal face 21A of the substrate 21, the second conductive portions 28 that are provided on the first principal face 21A of the substrate 21 and that are disposed with spacings as to the first conductive portions 27, the first reflective layer 23 that is provided on the first principal face 21A of the substrate 21 and that has the first openings 23A coinciding with the first conductive portions 27 and the second openings 23B coinciding with the second conductive portions 28, the LEDs (light-emitting parts) 16 that are attached on the first principal face 21A of the substrate 21 and that are connected to the first conductive portions 27 through the first openings 23A, the non-light-emitting parts 20 that are attached on the first principal face 21A of the substrate 21 and that are connected to the second conductive portions 28 through the second openings 23B, and the second reflective layer 24 that is provided on the first reflective layer 23, in which the second reflective layer 24 includes the first reflective portions 24A disposed around the LEDs 16, and the second reflective portions 24B disposed around the non-light-emitting parts 20.

The first reflective portions 24A making up the second reflective layer 24 provided on the first reflective layer 23 are provided around the LEDs 16, and accordingly light emitted from the LEDs 16 can be efficiently reflected. Thus, the usage efficiency of light can be improved. In addition to the first reflective portions 24A, the second reflective layer 24 also includes the second reflective portions 24B disposed around the non-light-emitting parts 20, and accordingly a heightwise gap is not readily formed between around the LEDs 16 and around the non-light-emitting parts 20. Accordingly, in a case of employing procedures of providing the first reflective layer 23 and the second reflective layer 24 on the first principal face 21A of the substrate 21, and thereafter providing the first conductive portions 27 and the second conductive portions 28 when manufacturing the backlight device 12, the first conductive portions 27 and the second conductive portions 28 can be appropriately provided. Thus, the problem in manufacturing due to the heightwise gap is resolved.

Also, the plurality of second reflective portions 24B may be disposed with spacings therebetween following the second openings 23B. The amount of material of the second reflective layer 24 that is used can be conserved as compared with a case of assuming that the second reflective portions are extend in ring-like forms following the second openings 23B.

Also, in the first reflective layer 23, the opening area of the second openings 23B may be larger than the opening area of the first openings 23A. The amount of material of the second reflective layer 24 that is used can be further conserved as compared with a case of assuming that the second reflective portions are extend in ring-like forms following the second openings 23B of which the opening area is larger than the opening area of the first openings 23A.

Also, the plurality of LEDs 16 may be disposed on the first principal face 21A of the substrate 21 with spacings therebetween, in the first reflective layer 23 the plurality of first openings 23A may be disposed on the first principal face 21A of the substrate 21 with spacings therebetween, and the plurality of first reflective portions 24A may be disposed on the first principal face 21A of the substrate 21 with spacings therebetween. The amount of material of the second reflective layer 24 that is used can be conserved as compared with a case of assuming that the first reflective portions are disposed as a solid pattern between two first openings 23A that are adjacent with spacings therebetween.

Also, the substrate 21 may have flexibility. In an arrangement in which the plurality of first reflective portions 24A are disposed on the first principal face 21A of the substrate 21 with spacings therebetween, a situation in which portions where the plurality of LEDs 16 are attached do not readily flex due to the first reflective portions 24A can be readily averted. In an arrangement in which a plurality of second reflective portions 24B are disposed so as to follow the second openings 23B with spacings therebetween, a situation in which portions of the substrate 21 where the non-light-emitting parts 20 are attached do not readily flex due to the second reflective portions 24B can be readily averted. Both are suitable for ensuring flexibility of the substrate 21.

Also, when sectioning the upper face of the first reflective layer 23 into the first region A1 that is around the LEDs 16 and the second region A2 that is around the non-light-emitting parts 20, the first coverage proportion of the first reflective portions 24A covering the first region A1 may be greater than the second coverage proportion of the second reflective portions 24B covering the second region A2. Due to the first coverage proportion being greater than the second coverage proportion, the light from the LEDs 16 can be efficiently reflected by the first reflective portions 24A. Thus, the usage efficiency of light can be further improved. Due to the second coverage proportion being smaller than the first coverage proportion, a situation in which the portion of the substrate 21 to which the non-light-emitting parts 20 are attached does not readily flex due to the second reflective portions 24B can be averted more readily, which is suitable in ensuring flexibility of the substrate 21.

Also, the substrate 21 may have the substrate main body 17A to which the LEDs 16 and the non-light-emitting parts 20 are attached, and the bent portion 17B that extends sidewards from the substrate main body 17A and is bent, in which the first reflective layer 23 is provided to the first principal face 21A of the bent portion 17B but the second reflective layer 24 is not formed thereon. When the bent portion 17B that extends sidewards from the substrate main body 17A is being bent, a situation in which bending is impeded due to the second reflective layer 24 can readily averted.

Also, the first reflective portions 24A may have ring-like forms that extend along the first openings 23A. Light from the LEDs 16 can be efficiently reflected by the first reflective portions 24A that have ring-like forms. Thus, usage efficiency of light can be further improved.

Also, the non-light-emitting parts 20 include the LED drivers (driving part) 20A that drive the LEDs 16. For example, connecting the control board (external board) 13 to supply electric power, various types of signals, and so forth, to the backlight device 12, does away with the need to provide the LED drivers 20A that drive the LEDs 16 on the control board 13. Thus, the size of the control board 13 can be reduced.

Also, the liquid crystal display device 10 according to the present embodiment includes the backlight device 12 described above, and the liquid crystal panel (display panel) 11 that performs display using light from the backlight device 12. According to the liquid crystal display device 10 having such a configuration, light emitted from the LEDs 16 is effectively reflected by the first reflective portions 24A making up the second reflective layer 24 and cast on the liquid crystal panel 11, and accordingly improved luminance of display images and reduction in electric power consumption can be realized.

Also, in the method of manufacturing the backlight device 12 according to the present embodiment, the first reflective layer 23 that has the first openings 23A and the second openings 23B that are provided with spacings as to the first openings 23A is provided on the first principal face 21A of the substrate 21, the second reflective layer 24 that has the first reflective portions 24A disposed around the first openings 23A and the second reflective portions 24B disposed around the second openings 23B is provided on the first reflective layer 23, the first conductive portions 27 that coincide with the first openings 23A and the second conductive portions 28 that coincide with the second openings 23B are provided on the first principal face 21A of the substrate 21, and the LEDs 16 that are connected to the first conductive portions 27 through the first openings 23A, and the non-light-emitting parts 20 that are connected to the second conductive portions 28 through the second openings 23B, are attached onto the first principal face 21A of the substrate 21.

When the LEDs 16 and the non-light-emitting parts 20 are attached upon the first principal face 21A of the substrate 21, the LEDs 16 are connected to the first conductive portions 27 through the first openings 23A, and the non-light-emitting parts 20 are connected to the second conductive portions 28 through the second openings 23B. The first reflective portions 24A included in the second reflective layer 24 are disposed around the LEDs 16, and accordingly light emitted from the LEDs 16 can be efficiently reflected. Thus, usage efficiency of light can be improved. Moreover, the second reflective portions 24B included in the second reflective layer 24 are disposed around the non-light-emitting parts 20, and accordingly a heightwise gap is not readily formed between around the LEDs 16 and around the non-light-emitting parts 20. Accordingly, at the time of providing the first reflective layer 23 and the second reflective layer 24, and thereafter providing the first conductive portions 27 and the second conductive portions 28 as described above, the first conductive portions 27 and the second conductive portions 28 can be appropriately provided. Thus, the problem in manufacturing due to the heightwise gap is resolved.

Also, the material of the first conductive portions 27 and the second conductive portions 28 is coated onto the first principal face 21A of the substrate 21 through the fourth openings 50A and the fifth openings 50B, by setting the mask 50 that has the fourth openings 50A coinciding with the first openings 23A and the fifth openings 50B coinciding with the second openings 23B, on the second reflective layer 24, at the time of providing the first conductive portions 27 and the second conductive portions 28, supplying the material of the first conductive portions 27 and the second conductive portions 28 onto the mask 50, and then moving the squeegee 51 disposed on the mask 50 along the mask 50 in a state of being pressed against the mask 50.

The material of the first conductive portions 27 and the second conductive portions 28 that is supplied onto the mask 50 is coated onto the first principal face 21A of the substrate 21 through the fourth openings 50A and the fifth openings 50B of the mask 50 as the squeegee 51 pressed against the mask 50 moves along the mask 50. Accordingly, the first conductive portions 27 that coincide with the first openings 23A of the first reflective layer 23, and the second conductive portions 28 that coincide with the second openings 23B, can be provided on the first principal face 21A of the substrate 21.

Now, assuming that deformation such as warping, flexing, and so forth of the mask 50 set on the second reflective layer 24 occurs, the material of the first conductive portions 27 and the second conductive portions 28 may not be coated at appropriate positions on the first principal face 21A of the substrate 21, or the amount coated may be insufficient.

With respect to this point, the second reflective layer 24 includes the first reflective portions 24A disposed around the first openings 23A and the second reflective portions 24B disposed around the second openings 23B, and accordingly a heightwise gap is not readily formed between around the first openings 23A and around the second openings 23B. Accordingly, when the mask 50 is set on the second reflective layer 24, the mask 50 is supported by the first reflective portions 24A around the first openings 23A and is supported by the second reflective portions 24B around the second openings 23B, whereby deformation such as warping, flexing, and so forth, does not readily occur at either of around the first openings 23A and around the second openings 23B. Thus, the material of the first conductive portions 27 and the second conductive portions 28 is coated at appropriate positions on the first principal face 21A of the substrate 21 through the fourth openings 50A and the fifth openings 50B, and the amount of coating thereof is also sufficient. Thus, the problem in manufacturing due to the heightwise gap is resolved.

Second Embodiment

A second embodiment will be described with reference to FIGS. 7 and 8. A case in which a third reflective layer 29 is added is set forth in this second embodiment. Note that repetitive description of structures, operations, and effects that are the same as those in the first embodiment described above will be omitted.

Figure 7:
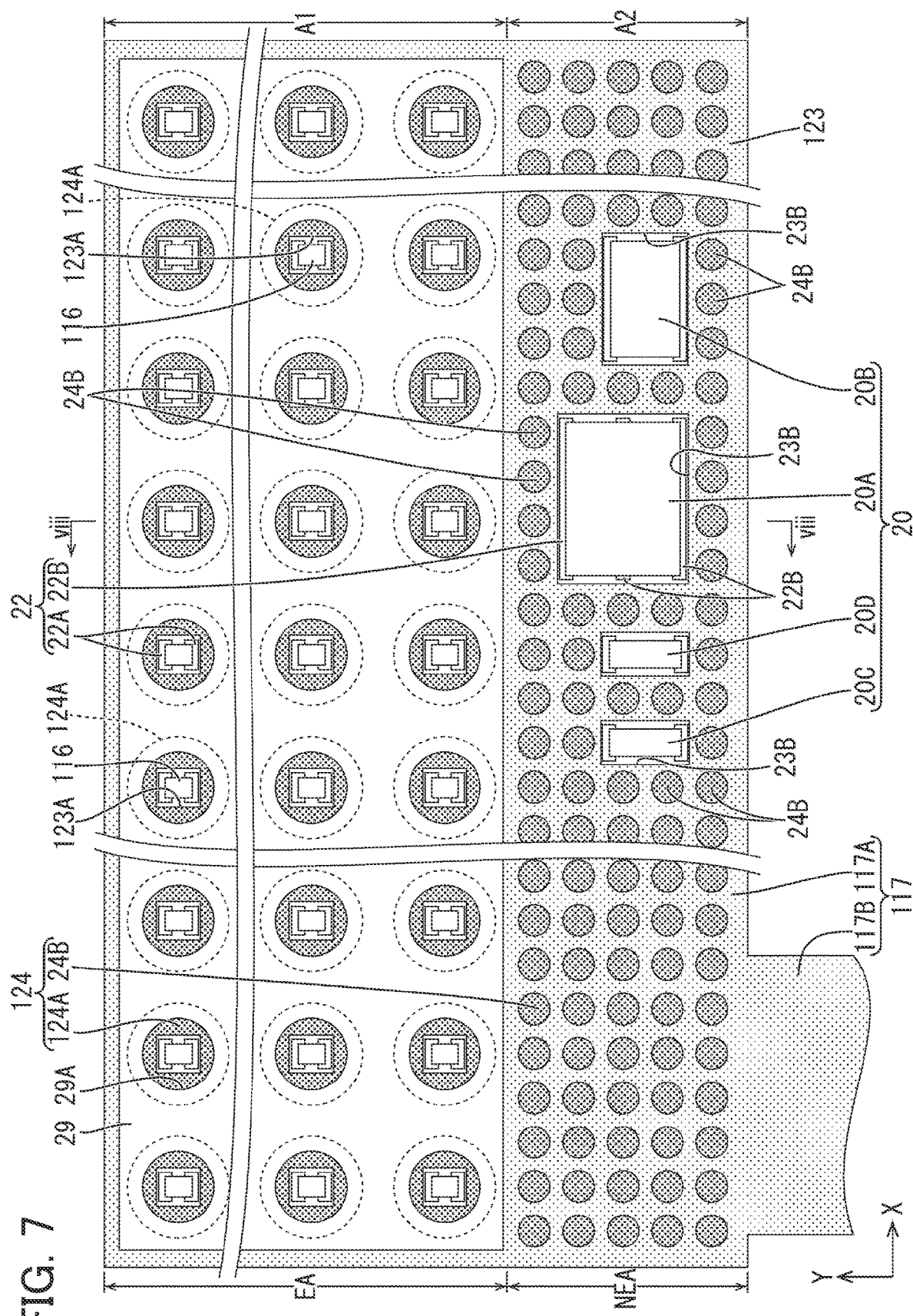
FIG. 7 is a plan view of an LED substrate according to a second embodiment.
Figure 8:
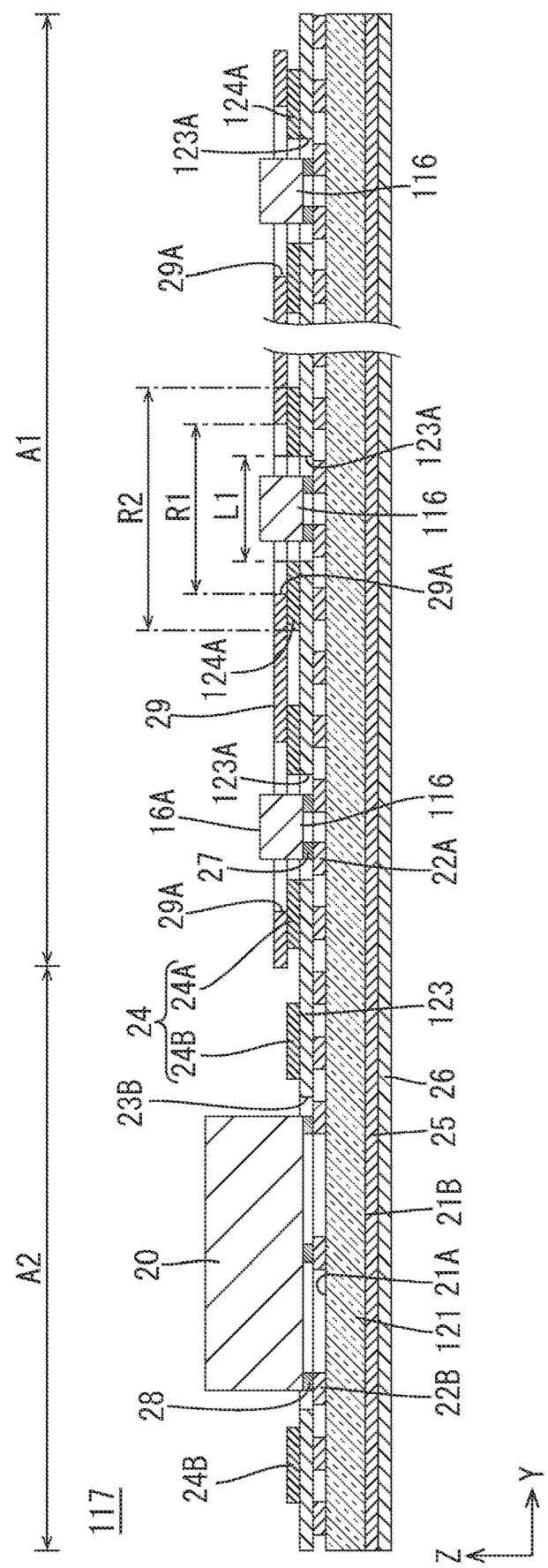
FIG. 8 is a cross-sectional view of the LED substrate according to the second embodiment, taken along line viii-viii in FIG. 7.

As illustrated in FIGS. 7 and 8, an LED substrate 117 according to the present embodiment may be provided with the third reflective layer 29 that may be provided on a second reflective layer 124. In FIG. 7, the formation range of the third reflective layer 29 is illustrated with no screening, and outer shapes of first reflective portions 124A are illustrated by dashed lines. Also, in FIG. 7, portions of the first reflective portions 124A that are not covered by the third reflective layer 29 and are exposed, are indicated by screening. The third reflective layer 29 is made of a reflective sheet that is manufactured as a separate part from the LED substrate 117. The third reflective layer 29 is made of a synthetic resin that has a white color and has high optical reflectivity (e.g., made of PET). An example of the reflective sheet used for the third reflective layer 29 is "EST100AR2-2", which is a product of Solartron Technology Co. Ltd. The thickness of the third reflective layer 29 is around 100 µm, for example. An adhesive layer is formed on a principal face on a rear side of the third reflective layer 29. The thickness of the adhesive layer provided to the third reflective layer 29 is around 25 µm, for example.

The third reflective layer 29 is provided on a portion of a substrate main body 117A of a substrate 121, and is not formed on a bent portion 117B. Specifically, the third reflective layer 29 is selectively provided on a range of the substrate main body 117A that coincides with the light-emitting region EA (first region A1), and is formed on neither the range of the substrate main body 117A that coincides with the non-light-emitting region NEA (second region A2) nor the entire region of the bent portion 117B. The third reflective layer 29 formed in such a range may have third openings 29A that coincide with first openings 123A. A plurality of the third openings 29A are disposed arrayed in a matrix each at positions with spacings therebetween in each of the X axis direction and the Y axis direction, in the same way as the array of the first openings 123A, LEDs 116, and the first reflective portions 124A. The third openings 29A are disposed at positions so as to be concentric with the first openings 123A, the LEDs 116, and the first reflective portions 124A. The planar shapes of the third openings 29A are circular. The diameter R1 of the third openings 29A may be larger than the long-side dimension L1 of the first openings 123A, and smaller than the diameter R2 of an outer peripheral edge of the first reflective portions 124A. Specifically, the diameter R1 of the third openings 29A is around 2 mm for example, and the difference thereof with the diameter R2 of the outer peripheral edge of the first reflective portions 124A (around 3 mm) is around 1 mm. Accordingly, there is a relation in which an annular portion of the third reflective layer 29 that includes opening edges of the third openings 29A coincides with an annular portion of the first reflective portions 124A including the outer peripheral edges thereof. That is to say, the third reflective layer 29 is disposed so as to coincide with at least a portion of the first reflective portions 124A of the second reflective layer 124.

Thus, a first reflective layer 123 and the second reflective layer 124 are layered on a lower-layer side of the third reflective layer 29 disposed around the LEDs 116, and accordingly the optical reflectivity of the third reflective layer 29 is even higher than portions where just the first reflective layer 123 and the second reflective layer 124 are layered. Thus, light emitted from the LEDs 116 can be more efficiently reflected by the third reflective layer 29 that is disposed around the LEDs 116 and that is over the first reflective layer 123 and the second reflective layer 124. Accordingly, usage efficiency of light can be further improved. Moreover, the diameter R1 of the third openings 29A is made larger than the long-side dimension L1 of the first openings 123A, when placing the third reflective layer 29 on the second reflective layer 124 at the time of manufacturing, and accordingly the LED 116 can be easily passed through the third openings 29A.

As described above, according to the present embodiment, the third reflective layer 29 may be provided on the second reflective layer 124, and the third reflective layer 29 may have the third openings 29A that coincide with the first openings 123A, and be disposed coinciding with at least a portion of the first reflective portions 124A of the second reflective layer 124. The third reflective layer 29 that is disposed coinciding with at least a portion of the first reflective portions 124A of the second reflective layer 124 is disposed around the LEDs 116, and accordingly light emitted from the LEDs 116 can be more efficiently reflected. Thus, usage efficiency of light can be further improved.

Third Embodiment

A third embodiment will be described with reference to FIG. 9. A case in which sealing portions 30 are added to the second embodiment described above is set forth in this third embodiment. Note that repetitive description of structures, operations, and effects that are the same as those in the first embodiment described above will be omitted.

Figure 9:
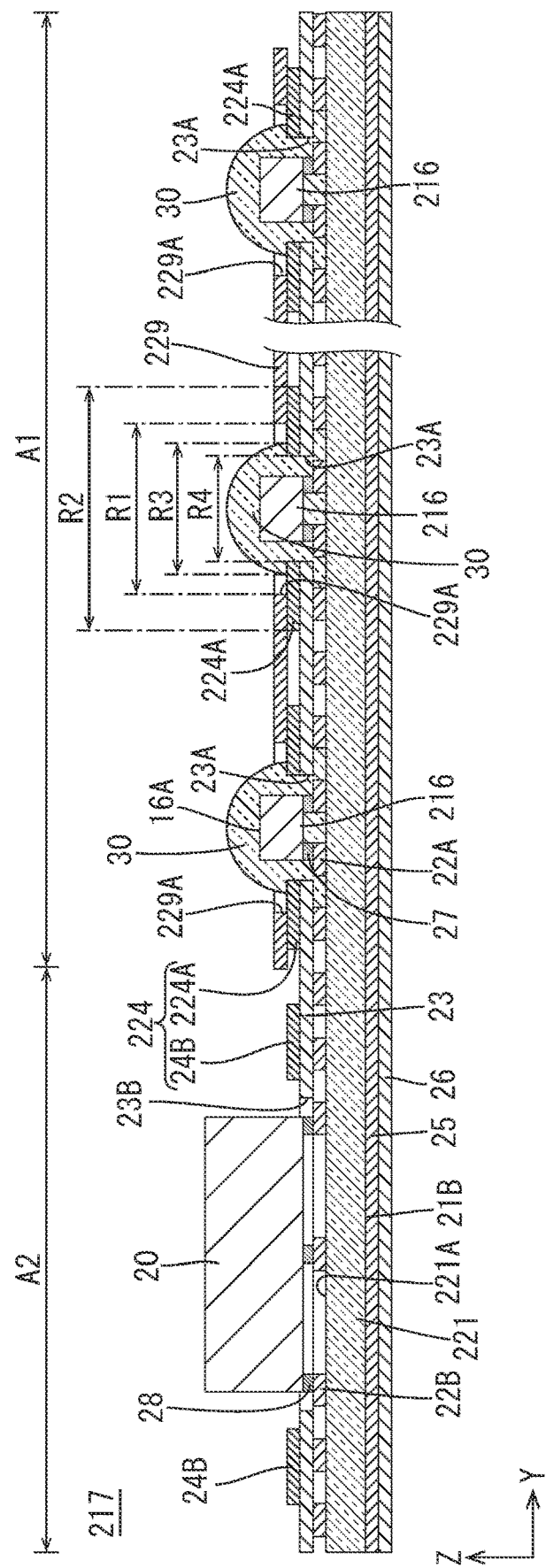
FIG. 9 is a cross-sectional view of an LED substrate according to a third embodiment, at the same cross-section position as in FIG. 4.

As illustrated in FIG. 9, the sealing portions 30 that seal LEDs 216 are provided on an LED substrate 217 according to the present embodiment. The sealing portions 30 may be provided on a first principal face 221A of a substrate 221. The sealing portions 30 are dome-like, and are provided so as to cover the entire regions of the LEDs 216 from a front side thereof. The sealing portions 30 are made of a synthetic resin such as silicone resin or the like, and have a high level of transparency and a high refractive index. An example of the silicone resin used for the sealing portions 30 is "SCR-1011(A/B)", which is a product of Shin-Etsu Chemical Co., Ltd. "SCR-1011(A/B)" is a two component type thermosetting organic silicone resin, made up of a component A and a component B. At the time of manufacturing, the LEDs 216 and so forth are attached to the LED substrate 217, following which the thermosetting organic silicone resin is delivered onto the LEDs 216 in drops, and cured, thereby providing the sealing portions 30. Sealing the LEDs 216 by the sealing portions 30 in this way enables the LEDs 216 to be protected. Also, using a material with a particularly high refractive index as the silicone resin for the sealing portions 30 enables light extraction efficiency to be improved.

The planar shape of the sealing portions 30 is circular. The diameter (radial dimension) R3 of the sealing portions 30 is larger than the inner diameter R4 of first reflective portions 224A, and smaller than the diameter (outer diameter) R2 of the first reflective portions 224A. Specifically, the diameter R3 of the sealing portions 30 is around 1 mm, for example. Note that the inner diameter R4 of the first reflective portions 224A is approximately the same value as the long-side dimension L1 of the first openings 123A, described in the second embodiment. The sealing portions 30 coincide with portions of the first reflective portions 224A including inner peripheral edges (inner edge portions) thereof. On the other hand, the sealing portions 30 do not coincide with portions of the first reflective portions 224A including outer peripheral edges (outer edge portions) thereof. A situation in which the entire regions of the first reflective portions 224A are covered by the sealing portions 30 is averted, and accordingly not all of the reflected light from the first reflective portions 224A is refracted by the sealing portions 30. Accordingly, the portions of the first reflective portions 224A not coinciding with the sealing portions 30 can reflect light from the LEDs 216 well. Also, portions including the inner edge portions of the first reflective portions 224A are protected by the coinciding sealing portions 30.

The diameter R3 of the sealing portions 30 may be smaller than the diameter R1 of third openings 229A of a third reflective layer 229. That is to say, in the third reflective layer 229, the third openings 229A may have a greater area on the first principal face 221A than the sealing portions 30. Now, at the time of manufacturing, the third reflective layer 229 is assembled after the sealing portions 30 are provided on the LEDs 216. Accordingly, at the time of placing the third reflective layer 229 on the second reflective layer 224, the sealing portions 30 can be easily passed through the third openings 229A, due to the third openings 229A having a greater area in the first principal face 221A than the sealing portions 30. Accordingly, a situation in which opening edges of the third openings 229A of the third reflective layer 229 ride up on the sealing portions 30 does not readily occur.

As described above, according to the present embodiment, the sealing portions 30 that are provided on the first principal face 221A of the substrate 221 and seal the LEDs 216 may be included, and the radial dimension of the sealing portions 30 may be larger than the inner diameter of the first reflective portions 224A, and smaller than the outer diameter of the first reflective portions 224A. The LEDs 216 can be protected by sealing the LEDs 216 with the sealing portions 30. The sealing portions 30 coincide with portions including the inner peripheral edges of the first reflective portions 224A that have ring-like forms, but do not coincide with portions of the first reflective portions 224A including the outer peripheral edges thereof. A situation in which the entire regions of the first reflective portions 224A are covered by the sealing portions 30 is averted, and accordingly not all of the reflected light from the first reflective portions 224A is refracted by the sealing portions 30. Accordingly, the portions of the first reflective portions 224A not coinciding with the sealing portions 30 can reflect light from the LEDs 216 well. Also, portions including the inner edge portions of the first reflective portions 224A are protected by the coinciding sealing portions 30.

Also, the sealing portions 30 that are provided on the first principal face 221A of the substrate 221 and seal the LEDs 216 may be included, and in the third reflective layer 229, the third openings 229A may have a greater area on the first principal face 221A than the sealing portions 30. The LEDs 216 can be protected by sealing the LEDs 216 with the sealing portions 30. The sealing portions 30 can be easily passed through the third openings 229A of the third reflective layer 229. Accordingly, in a case in which the third reflective layer 229 is a separate part from the substrate 221, for example, when assembling the third reflective layer 229 to the substrate 221, a situation in which the opening edges of the third openings 229A of the third reflective layer 229 ride up on the sealing portions 30 does not readily occur.

Fourth Embodiment

A fourth embodiment will be described with reference to FIG. 10. A case in which the array spacings of LEDs 316 are changed from the above-described first embodiment, and third reflective portions 24C are added is set forth in this fourth embodiment. Note that repetitive description of structures, operations, and effects that are the same as those in the first embodiment described above will be omitted.

Figure 10:
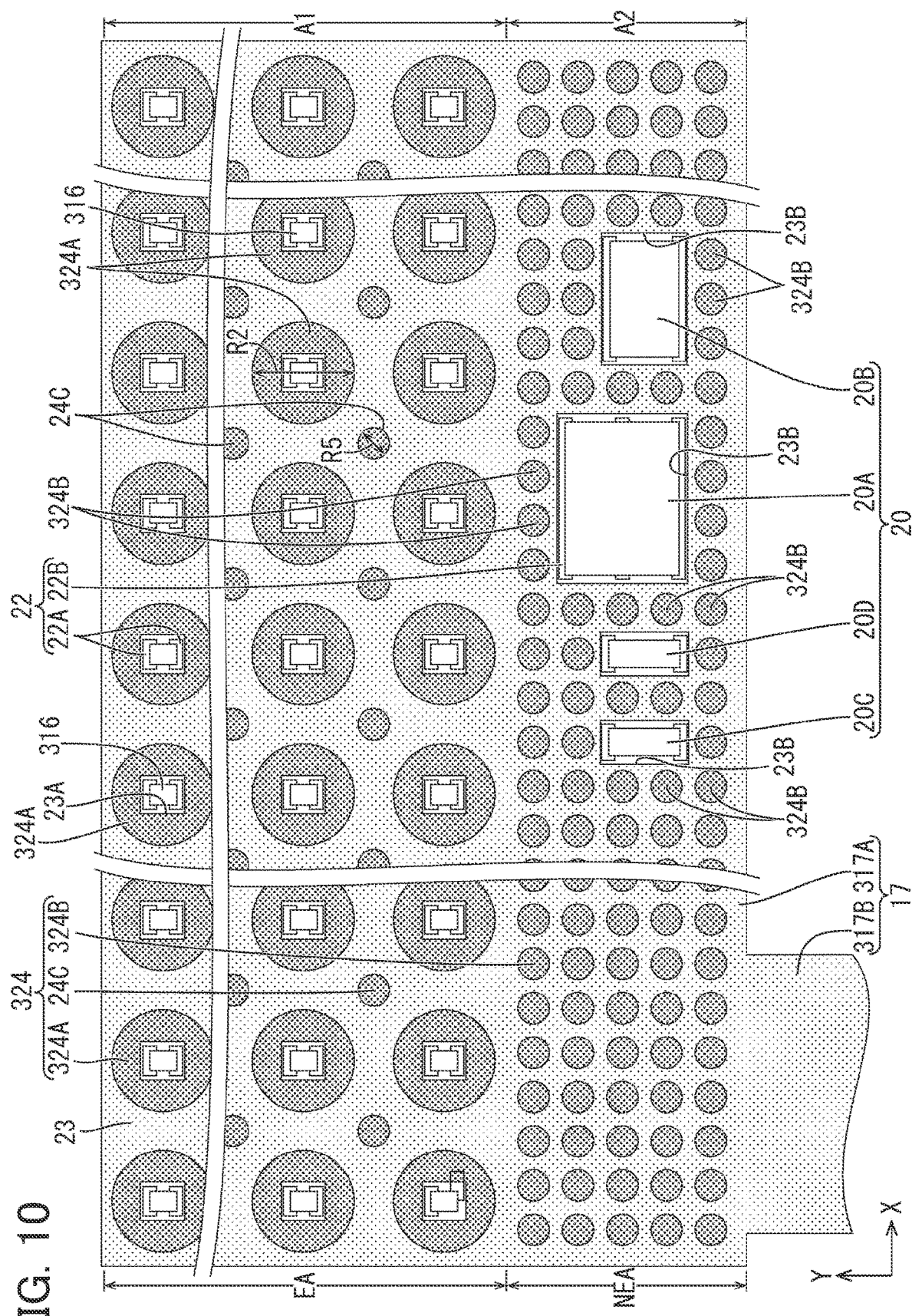
FIG. 10 is a plan view of an LED substrate according to a fourth embodiment.

As illustrated in FIG. 10, the array spacings of a plurality of the LEDs 316 according to the present embodiment with respect to the X axis direction and the Y axis direction is wider than the array spacings of the plurality of LEDs 16 described in the first embodiment (see FIG. 3). The diameter R2 of a plurality of first reflective portions 324A is the same as that in the first embodiment. Accordingly, spacings between first reflective portions 324A that are adjacent to each other in the X axis direction and the Y axis direction are wider as compared to those in the first embodiment.

In addition to the first reflective portions 324A and second reflective portions 324B, a second reflective layer 324 may also include third reflective portions 24C disposed between two first reflective portions 324A that are adjacent with spacings therebetween. Specifically, the third reflective portions 24C are selectively provided in a range of a substrate main body 317A that coincides with the light-emitting region EA (first region A1), and are formed in neither of a range of the substrate main body 317A that coincides with the non-light-emitting region NEA (second region A2) nor the entire region of the bent portion 317B. The planar shapes of the third reflective portions 24C are circular. The diameter R5 of the third reflective portions 24C is smaller than the diameter R2 of the first reflective portions 324A. The third reflective portions 24C are disposed at positions that are intermediate between the first reflective portions 324A (LEDs 316) that are adjacent in the X axis direction, and at positions that are intermediate between the first reflective portions 324A (LEDs 316) that are adjacent in the Y axis direction. A plurality of the third reflective portions 24C are disposed arrayed in a matrix each at positions with spacings therebetween in each of the X axis direction and the Y axis direction. The plurality of third reflective portions 24C are arrayed staggered as to the plurality of first reflective portions 324A. As described above, even in a case in which the spacing between two first reflective portions 324A that are adjacent is wider, a heightwise gap around the LEDs 316 is not readily formed, due to the third reflective portions 24C being disposed between the two first reflective portions 324A that are adjacent. Accordingly, the first conductive portions 27 and the second conductive portions 28 (see FIG. 4) can be appropriately provided.

As described above, according to the present embodiment, the second reflective layer 324 includes the third reflective portions 24C disposed between two first reflective portions 324A that are adjacent with spacing therebetween. Even in a case in which the spacing between two first reflective portions 324A that are adjacent is wider, a heightwise gap around the LEDs 316 is not readily formed, due to the third reflective portions 24C being disposed between the two first reflective portions 324A that are adjacent. Accordingly, the first conductive portions 27 and the second conductive portions 28 can be appropriately provided.

Fifth Embodiment

A fifth embodiment will be described with reference to FIG. 11. A case in which the third reflective layer 229 is omitted from the above-described third embodiment is set forth in this fifth embodiment. Note that repetitive description of structures, operations, and effects that are the same as those in the third embodiment described above will be omitted.

Figure 11:
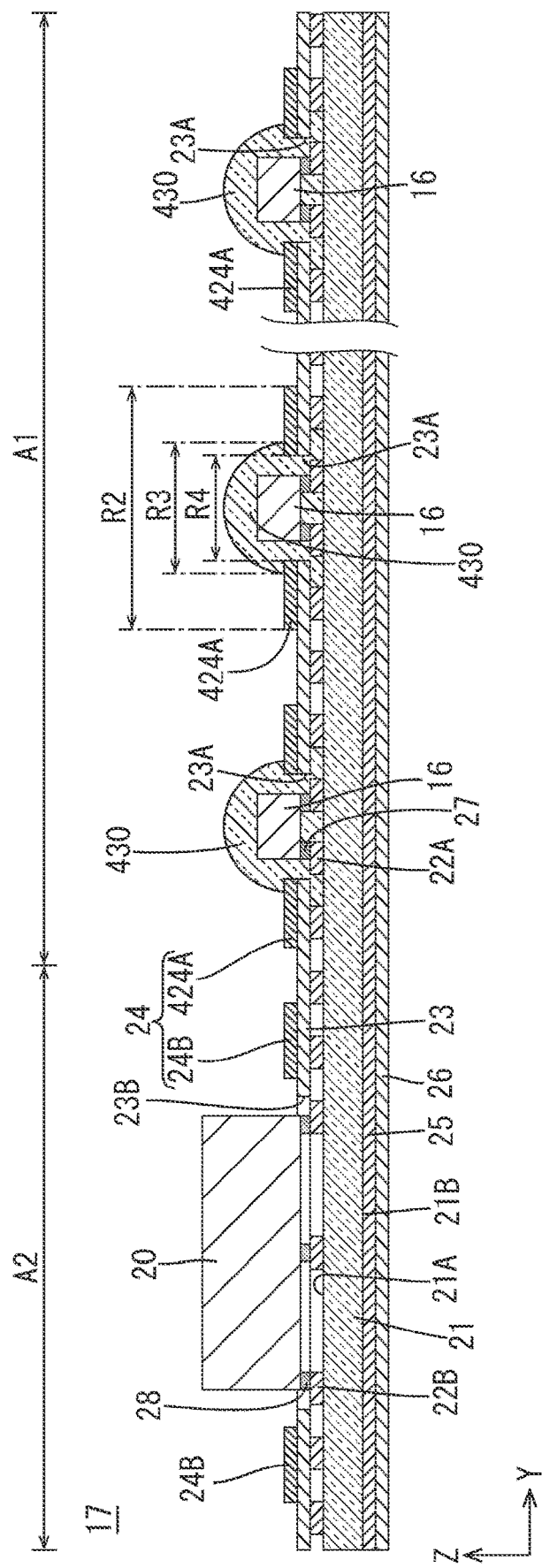
FIG. 11 is a cross-sectional view of an LED substrate according to a fifth embodiment, at the same cross-section position as in FIG. 4.

As illustrated in FIG. 11, the diameter (radial dimension) R3 of sealing portions 430 according to the present embodiment is larger than the inner diameter R4 of first reflective portions 424A, and smaller than the diameter (outer diameter) R2 of the first reflective portions 424A. According to the sealing portions 430 of the present embodiment, operations and effects the same as those of the third embodiment can be obtained.

OTHER EMBODIMENTS

The technology disclosed in the present specification is not limited to the embodiments described in the above description and the drawings, and embodiments such as those below, for example, are also included in the technical scope.

(1) The planar shape of the first reflective portions 24A, 124A, 224A, 324A, and 424A can be changed as appropriate. The planar shape of the first reflective portions 24A, 124A, 224A, 324A, and 424A can be, for example, ring-like forms such as triangles, squares, pentagons, or polygons with more vertices, or may be ring-like forms that are ellipses or ovals. In a case in which the planar shape of the first reflective portions 24A, 124A, 224A, 324A, and 424A is square, the outer shape of the first reflective portions 24A, 124A, 224A, 324A, and 424A may be similar to the outer shape of the LEDs 16, 116, 216, and 316.

(2) The planar shape of the first reflective portions 24A, 124A, 224A, 324A, and 424A may be non-ring-like forms that do not surround the first openings 23A and 123A. For example, a plurality of the first reflective portions 24A, 124A, 224A, 324A, and 424A may be provided in a form of being arrayed so as to follow the first openings 23A and 123A with spacings therebetween.

(3) The planar shape of the second reflective portions 24B and 324B can be changed as appropriate. The planar shape of the second reflective portions 24B and 324B can be, for example, triangles, squares, pentagons, or polygons with more vertices, or can be ellipses or ovals.

(4) The second reflective portions 24B and 324B may be arrayed staggered in plan view in the first principal face 21A and 221A of the LED substrate 17, 117, and 217.

(5) In the configuration according to the fourth embodiment, the planar shape of the third reflective portions 24C can be changed as appropriate. The planar shape of the third reflective portions 24C can be, for example, triangles, squares, pentagons, or polygons with more vertices, or can be ellipses or ovals.

(6) The planar shape of the first openings 23A and 123A of the first reflective layer 23 and 123 can be changed as appropriate. The planar shape of the first openings 23A and 123A can be, for example, triangles, pentagons, or polygons with more vertices, or can be ellipses or ovals.

(7) The planar shape of the second openings 23B of the first reflective layer 23 and 123 can be changed as appropriate. The planar shape of the second openings 23B can be, for example, triangles, pentagons, or polygons with more vertices, or can be ellipses or ovals.

(8) In the configurations according to the second and third embodiments, the planar shape of the third openings 29A and 229A of the third reflective layer 29 and 229 can be changed as appropriate. The planar shape of the third openings 29A and 229A can be, for example, triangles, squares, pentagons, or polygons with more vertices, or can be ellipses or ovals.

(9) The planar shape of the LEDs 16, 116, 216, and 316 may be, for example, squares, circles, or the like, besides rectangles. The planar shapes of the first openings 23A and 123A of the first reflective layer 23 and 123, and the first reflective portions 24A, 124A, 224A, 324A, and 424A, can be changed in conjunction with the planar shape of the LEDs 16, 116, 216, and 316 being changed.

(10) The LEDs 16, 116, 216, and 316 may be arrayed staggered in plan view on the first principal face 21A and 221A of the LED substrate 17, 117, and 217. In this case, the arrays of the first reflective portions 24A, 124A, 224A, 324A, and 424A and the first openings 23A and 123A are also changed to staggered arrays, the same as with the LEDs 16, 116, 216, and 316.

(11) While LEDs that emit white light can be used as the LEDs 16, 116, 216, and 316, besides blue LEDs. In this case, the wavelength conversion sheet 18C can be omitted from the optical member 18.

(12) The planar shape of the non-light-emitting part 20 may be, for example, squares, circles, or the like, besides rectangles. The planar shapes of the second openings 23B of the first reflective layer 23 and 123 can be changed in conjunction with the planar shape of the non-light-emitting parts 20 being changed.

(13) Specific numerical values of the dimensions of the components, array spacings, and so forth, relating to the LED substrate 17, 117, and 217, can be changed to others besides those described above as appropriate.

(14) In the configurations described in the third and fifth embodiments, the specific planar shape and cross-sectional shape of the sealing portions 30 and 430 can be changed as appropriate.

(15) In the configurations described in the third and fifth embodiments, fluorescent substances (e.g., green fluorescent substance and red fluorescent substance) can be contained in the sealing portions 30 and 430. In this case, the wavelength conversion sheet 18C can be omitted from the optical member 18.

(16) In the configurations described in the third and fifth embodiments, the sealing portions 30 and 430 may be made of a material such as epoxy resin or the like, besides silicone resin.

(17) The fluorescent substance contained in the wavelength conversion sheet 18C or the sealing portions 30 and 430 may be a yellow fluorescent substance, besides the green fluorescent substance and the red fluorescent substance.

(18) The substrate 21, 121, and 221 of the LED substrate 17, 117, and 217 may be a rigid substrate that has almost no flexibility. The rigid substrate may be made of a material in which glass cloth is impregnated with epoxy resin. Separately, the rigid substrate may be made of a material in which a composite base material obtained by combining glass cloth and glass unwoven fabric is impregnated with Bismaleimide-Triazine (BT) resin. Also, the rigid substrate may be made of a ceramic material. Note that in a case in which the substrate 21, 121, and 221 is a rigid substrate, the bent portion 17B, 117B, and 317B is omitted.

(19) Even in a case in which the substrate 21, 121, and 221 of the LED substrate 17, 117, and 217 is the rigid substrate according to (18) described above, advantages of conservation of material for the second reflective layer 24, 124, 224, and 324 can be obtained by the configuration in which the plurality of first reflective portions 24A, 124A, 224A, 324A, and 424A are disposed with spacings therebetween.

(20) The number, types, order of layering, and so forth, of the optical member 18 can be changed as appropriate.

(21) The specific configurations of the diffusion plate 18A and the diffusion sheet 18B included in the optical member 18 can be changed as appropriate.

(22) A dichroic filter may be included in the optical member 18. The dichroic filter functions as a "blue transmission filter" by transmitting blue light (primary light) that is the emitted light of the LEDs 16, 116, 216, and 316, while reflecting other visible light (green light and red light (secondary light) or the like).

(23) Organic electroluminescent (EL) devices may be used as the light-emitting parts instead of the LEDs 16, 116, 216, and 316.

(24) In the liquid crystal panel 11, the color filters may be provided on the array substrate 11B.

The present disclosure contains subject matter related to that disclosed in Japanese Priority Patent Application JP 2023-024885 filed in the Japan Patent Office on Feb. 21, 2023, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A lighting device, comprising:
   a substrate that has a first principal face;
   a first conductive portion that is provided on the first principal face of the substrate;
   a second conductive portion that is provided on the first principal face of the substrate and that is disposed with a spacing as to the first conductive portion;
   a first reflective layer that is provided on the first principal face of the substrate and that has
   a first opening coinciding with the first conductive portion, and
   a second opening coinciding with the second conductive portion;
   a light-emitting part that is attached on the first principal face of the substrate and that is connected to the first conductive portion through the first opening;
   a non-light-emitting part that is attached on the first principal face of the substrate and that is connected to the second conductive portion through the second opening; and
   a second reflective layer that is provided on the first reflective layer, wherein
   the second reflective layer includes a first reflective portion disposed around the light-emitting part, and a second reflective portion disposed around the non-light-emitting part.

2. The lighting device according to claim 1, wherein a plurality of the second reflective portion are disposed with spacings therebetween following the second opening.

3. The lighting device according to claim 2, wherein, in the first reflective layer, an opening area of the second opening is larger than an opening area of the first opening.

4. The lighting device according to claim 1, wherein
   a plurality of the light-emitting part are disposed on the first principal face of the substrate with spacings therebetween,
   in the first reflective layer, a plurality of the first opening are disposed on the first principal face of the substrate with spacings therebetween, and
   a plurality of the first reflective portion are disposed on the first principal face of the substrate with spacings therebetween.

5. The lighting device according to claim 4, wherein the second reflective layer includes a third reflective portion that is disposed between two of the first reflective portions that are adjacent, with spacing therebetween.

6. The lighting device according to claim 2, wherein the substrate has flexibility.

7. The lighting device according to claim 6, wherein, when sectioning an upper face of the first reflective layer into a first region that is around the light-emitting part and a second region that is around the non-light-emitting part, a first coverage proportion of the first reflective portion covering the first region is greater than a second coverage proportion of the second reflective portion covering the second region.

8. The lighting device according to claim 6, wherein the substrate has
   a substrate main body to which the light-emitting part and the non-light-emitting part are attached, and
   a bent portion that extends sidewards from the substrate main body and that is bent, and
   the first reflective layer is provided to the first principal face of the bent portion, but the second reflective layer is not formed thereon.

9. The lighting device according to claim 1, further comprising:
   a third reflective layer that is provided on the second reflective layer, wherein
   the third reflective layer has a third opening that coincides with the first opening, and is disposed coinciding with at least a portion of the first reflective portion of the second reflective layer.

10. The lighting device according to claim 9, further comprising:

a sealing portion that is provided on the first principal face of the substrate and that seals the light-emitting part, wherein in the third reflective layer, the third opening has a greater area on the first principal face than the sealing portion.

11. The lighting device according to claim 1, wherein the first reflective portion has a ring-like form that extends along the first opening.

12. The lighting device according to claim 11, further comprising:

a sealing portion that is provided on the first principal face of the substrate and that seals the light-emitting part, wherein a radial dimension of the sealing portion is larger than an inner diameter of the first reflective portion, and smaller than an outer diameter of the first reflective portion.

13. The lighting device according to claim 1, wherein the non-light-emitting part includes a driving part that drives the light-emitting part.

14. A display device, comprising:

the lighting device according to claim 1; and a display panel that performs display using light from the lighting device.

15. A method of manufacturing a lighting device, the method comprising:

providing a first reflective layer that has a first opening and a second opening that is provided with a spacing as to the first openings, on a first principal face of a substrate;

providing a second reflective layer that has a first reflective portion disposed around the first opening and a second reflective portion disposed around the second opening, on the first reflective layer;

providing a first conductive portion that coincides with the first opening, and a second conductive portion that coincides with the second opening, on the first principal face of the substrate; and attaching a light-emitting part that is connected to the first conductive portion through the first opening, and a non-light-emitting part that is connected to the second conductive portion through the second opening, onto the first principal face of the substrate.

16. The method of manufacturing a lighting device according to claim 15, the method further comprising:

coating a material of the first conductive portion and the second conductive portion onto the first principal face of the substrate through a fourth opening and a fifth opening of a mask, by setting the mask that has the fourth opening coinciding with the first opening and the fifth opening coinciding with the second opening, on the second reflective layer, at a time of providing the first conductive portion and the second conductive portion, supplying the material of the first conductive portion and the second conductive portion onto the mask, and moving a squeegee disposed on the mask along the mask in a state of being pressed against the mask.

* * * * *